(12) United States Patent
Singh

(10) Patent No.: US 9,705,525 B1
(45) Date of Patent: Jul. 11, 2017

(54) MULTIPLE RESOLUTION TEMPERATURE SENSOR

(71) Applicant: SanDisk Technologies LLC, Plano, TX (US)

(72) Inventor: Saurabh Kumar Singh, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/178,377

(22) Filed: Jun. 9, 2016

(51) Int. Cl.
*H03M 3/00* (2006.01)
*G05F 3/24* (2006.01)
*G01K 1/02* (2006.01)

(52) U.S. Cl.
CPC ............ *H03M 3/458* (2013.01); *G01K 1/028* (2013.01); *G05F 3/245* (2013.01)

(58) Field of Classification Search
CPC ...... H03M 3/424; H03M 3/422; H03M 3/464; H03M 3/496; H03M 3/454; H03M 3/37; H03M 1/182; H03M 1/165; H03M 1/365; H03M 3/458; G01K 1/028; G05F 3/245
USPC ......................................................... 341/143
See application file for complete search history.

(56) References Cited

U.S. PATENT DOCUMENTS

| | | |
|---|---|---|
| 5,559,514 A | 9/1996 | Thomson |
| 8,096,707 B2 | 1/2012 | Raychowdhury et al. |
| 2003/0151532 A1* | 8/2003 | Chen ..................... H03M 1/165 341/120 |
| 2004/0004994 A1 | 1/2004 | Wu et al. |
| 2007/0290907 A1* | 12/2007 | Doerrer ................. H03M 3/424 341/143 |
| 2015/0369674 A1 | 12/2015 | Ma |
| 2016/0056838 A1* | 2/2016 | Zhang ................... H03M 3/422 341/143 |

FOREIGN PATENT DOCUMENTS

EP 2295944 A2 1/2010

* cited by examiner

*Primary Examiner* — Lam T Mai
(74) *Attorney, Agent, or Firm* — Vierra Magen Marcus LLP

(57) ABSTRACT

A sensor that can provide multiple resolutions, based on the output of the same analog-to-digital converter is disclosed. Some applications require a fast measurement of a physical parameter (e.g., temperature, voltage, pressure), but can tolerate a lower resolution measurement. Other applications require a higher resolution measurement, but can tolerate a slower measurement. The sensor may comprise a sigma delta modulator (SDM) ADC that outputs a digital reading. The output may comprise a bus having a width that is equal to the desired highest resolution of the digital code for the physical parameter. The sensor may further comprise a storage unit for each desired level of resolution. The sensor may further comprise logic that causes the storage units to sample the output bus after a certain number of clock cycles in order to store a digital code having a number of bits equal to the resolution.

20 Claims, 31 Drawing Sheets

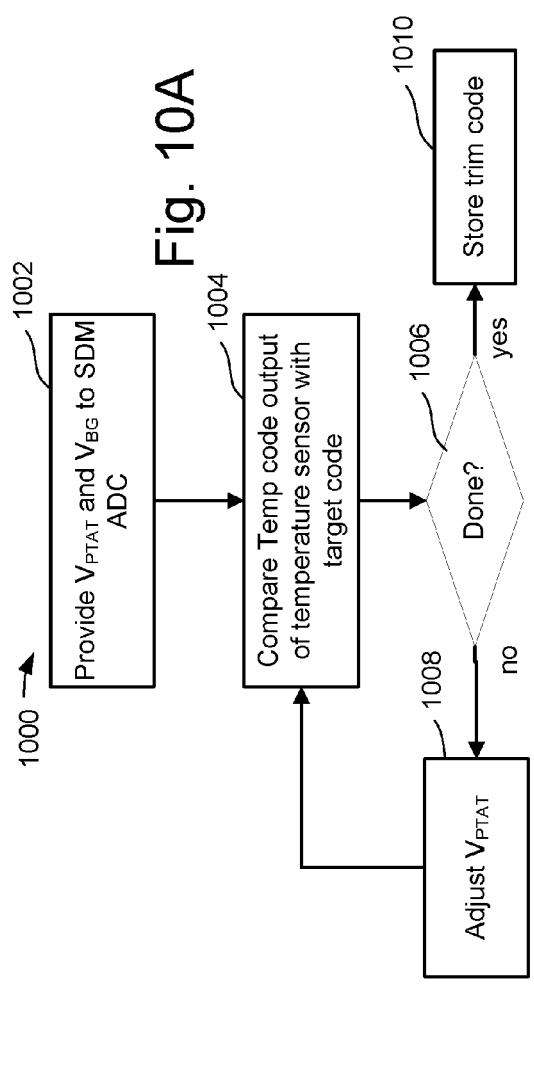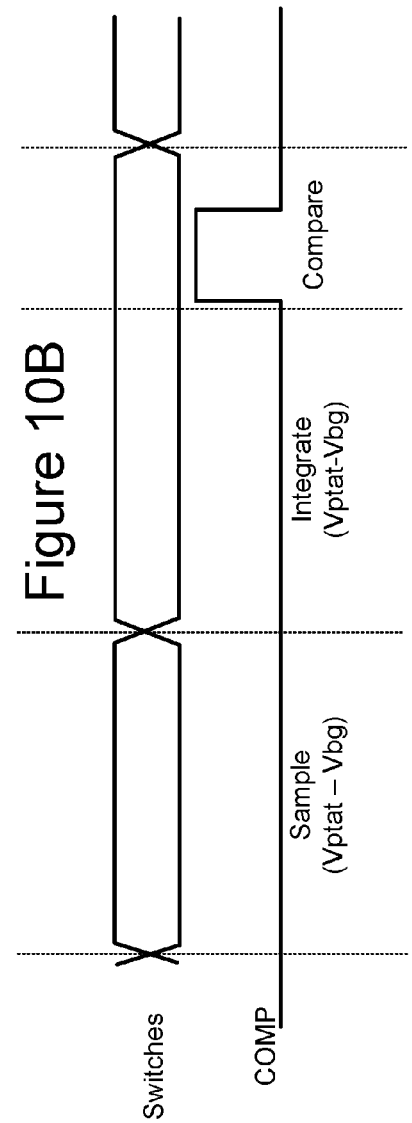

MULTIPLE RESOLUTION TEMPERATURE SENSOR

CLAIM OF PRIORITY

This present application claims priority from Indian Patent Application No. 201641007651, entitled, "MULTIPLE RESOLUTION TEMPERATURE SENSOR," filed Mar. 4, 2016, incorporated by reference herein in its entirety.

BACKGROUND

Semiconductor devices are expected to operate over a wide temperature range. However, various electrical components exhibit a temperature dependence. For example, temperature affects many transistor parameters, the dominant among which is the threshold voltage.

As one example, in NAND flash memory devices, temperature variations present various issues in reading and writing data. A memory device is subject to varying temperatures based on the environment in which it is located. For example, some memory devices are rated for use between −40° C. and +85° C. Devices in industrial, military and even consumer applications may experience significant temperature variations. Temperature variations can cause read errors and widen the threshold voltage distributions of the different states of a non-volatile storage element.

Many other types of semiconductor devices have a need for temperature sensors.

BRIEF DESCRIPTION OF THE DRAWINGS

Like-numbered elements refer to common components in the different figures.

FIG. 10A is a flowchart of a process of trimming $V_{PTAT}$.

FIGS. 10B-10G are diagrams that illustrate switch operation in one embodiment of trimming $V_{PTAT}$.

DETAILED DESCRIPTION

Figure 1:
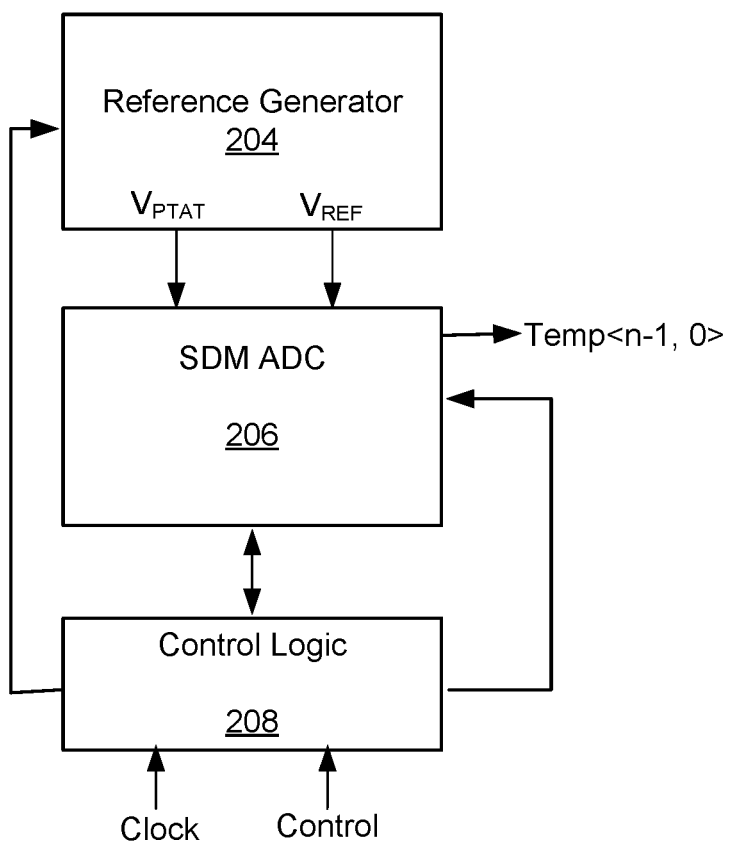
FIG. 1 is a block diagram of one embodiment of a temperature sensor.

A temperature sensor is disclosed herein. Temperature sensors, in general, require trimming to achieve high accuracy. This trimming may be performed at one or more reference temperatures. Trimming may be performed at two temperatures to increase the accuracy. However, trimming at two temperatures may increase cost. A part of the additional cost may be for specialized and expensive test setup external to the device under test. In one embodiment, trimming of a temperature sensor uses a single temperature trimming.

A temperature sensor may provide a digital output from which temperature can be calculated using an equation. In one embodiment, a temperature sensor provides a digital output having a precise amount of degrees/code step. For example, each step in the digital output code may correspond to one degree Celsius, 0.5 degrees Celsius, 2 degrees Celsius or some other fixed amount of degree Celsius per digital code. This allows the temperature to be more easily calculated from the digital output. This can save on hardware used to calculate the temperature from the digital output of the temperature sensor.

In one embodiment, a temperature sensor comprises a precision band-gap circuit and a sigma delta modulator (SDM) analog-to-digital convertor (ADC). The precision band-gap circuit produces a bandgap voltage that is one input of the SDM ADC. The temperature sensor may also comprise a proportional to absolute temperature (PTAT) circuit. The PTAT circuit produces a PTAT voltage that is also provided as an input to the SDM ADC. Note that the precision band-gap circuit and the PTAT circuit may share common circuitry. The SDM ADC produces an output based on the difference between the PTAT voltage and the bandgap voltage, in one embodiment. The temperature sensor may also have logic that outputs a temperature code based on the output of the SDM ADC.

In one embodiment, using the difference between the PTAT voltage and the bandgap voltage as an input to the SDM ADC helps to establish a desired temperature for the lowest temperature code. The following example will be used to illustrate. It might be expected that a device might be operated between about −40 degrees Celsius to about 125 degrees Celsius. This range is about 165 degrees. If each bit in the temperature code is to correspond to 1 degree Celsius, the temperature code should be at least eight bits. Moreover, for some devices, the middle code (e.g., 1000_0000 using an eight bit temperature code as an example) might be assigned a specified temperature (e.g., 85 degrees Celsius). This means that the lowest code (0000_0000 in the present example) should correspond to −43 degrees Celsius. Having the SDM ADC produce an output based on the difference between the PTAT voltage and the bandgap voltage helps to establish a target temperature (e.g., −43 degrees Celsius) for the lowest code.

In one embodiment, in which a PTAT voltage and a bandgap voltage are inputs to a SDM ADC in a temperature sensor, the bandgap voltage is scaled. Scaling the bandgap voltage helps to establish a relationship of one degree Celsius per bit in the temperature code, in one embodiment. The relationship could be some other fixed amount of degrees Celsius per bit in the temperature code. The bandgap voltage is scaled by the size of certain capacitors in the SDM ADC, in one embodiment.

In one embodiment, single temperature trimming of a temperature sensor having an SDM ADC is performed. The SDM ADC may input a bandgap voltage, which may be compared to a PTAT voltage. The SDM ADC may have capacitors (e.g., scaling capacitors) that are used to scale the bandgap voltage. The single temperature trimming may include trimming the band gap voltage, trimming the scaling capacitors, and trimming the PTAT voltage. In one embodiment, the trimming order is to first trim the band gap voltage, then trim the scaling capacitors, and then trim the PTAT voltage.

Some applications require a fast measurement of a physical parameter (e.g., temperature, voltage, pressure), but can tolerate a lower resolution measurement. Other applications require a higher resolution measurement, but can tolerate a slower measurement. One embodiment includes a sensor that can provide multiple resolutions, based on the output of the same analog-to-digital converter. The sensor may comprise a sigma delta modulator (SDM) ADC that outputs a digital reading. When the digital reading is first output by the SDM ADC, it may not be very accurate. The SDM ADC may update the digital reading (e.g., each clock cycle), such that the digital reading becomes more accurate over time. The output of the SDM ADC may comprise a bus having a width that is equal to the desired highest resolution of the digital code for the physical parameter. The sensor may further comprise a storage unit for each desired level of resolution. The sensor may further comprise logic that causes the storage units to sample the output bus after a certain number of clock cycles in order to store a digital code having a number of bits equal to the resolution. Thus, a faster, lower resolution reading may be obtained or, alternatively, a slower, higher resolution reading may be obtained.

FIG. 1 is a block diagram of one embodiment of a temperature sensor 142. The temperature sensor 142 includes a reference generator 204, an SDM ADC 206, and control logic 208.

The reference generator 204 generates a voltage that is proportional to absolute temperature ($V_{PTAT}$), as well as a reference voltage ($V_{REF}$). In one embodiment, $V_{REF}$ is a bandgap voltage (e.g., $V_{BG}$). $V_{PTAT}$ may be based on the bandgap voltage. In one embodiment, reference generator 204 is offset compensated. Offset compensation may compensate for non-ideal factors in the components that make up reference generator 204. For example, there may be mismatches between transistors, diodes, resistors, etc., for which compensation may be provided.

The reference voltage may be a constant voltage regardless of factors including, but not limited to, power supply variations, temperature changes, and circuit loading, in one embodiment. Thus, $V_{REF}$ is temperature independent, in one embodiment.

As noted, in one embodiment, $V_{REF}$ is a band gap voltage ($V_{BG}$). In one embodiment, the reference generator 204 comprises a band gap voltage circuit. As one example, a band gap voltage circuit may output a voltage close to the bandgap of silicon at 0 degrees Kelvin. Thus, $V_{REF}$ could be about 1.25 volts, using the bandgap of silicon as an example. However, note that $V_{REF}$ is not limited to being a band gap voltage.

The SDM ADC 206 inputs $V_{PTAT}$ and $V_{REF}$ and outputs a "n bit" temperature code (Temp<n−1,0>). In one embodiment, the SDM ADC 206 uses sigma delta modulation. In one embodiment, SDM ADC 206 is a single bit SDM ADC. In one embodiment, SDM ADC 206 is a first order SDM ADC. In one embodiment, SDM ADC 206 is a first-order, single-bit SDM ADC. In one embodiment, $V_{PTAT}$ is input to one input (e.g., non-inverting input) of a differential amplifier in the SDM ADC 206 and $V_{REF}$ is input to another input (e.g., inverting input) of the differential amplifier in the SDM ADC 206. This may be stated as using $V_{PTAT}-V_{REF}$ as an input (e.g., temperature input) of the differential amplifier. As noted, $V_{REF}$ is a bandgap voltage, in one embodiment. $V_{PTAT}$ is an analog signal, in one embodiment. $V_{REF}$ may be referred to as a "reference signal."

In one embodiment, the SDM ADC 206 uses sigma delta modulation to generate an output based on a difference between $V_{PTAT}$ and $V_{REF}$. As noted, $V_{REF}$ may be a bandgap voltage. Hence, SDM ADC 206 may generate an output based on a difference between $V_{PTAT}$ and a bandgap voltage.

The control logic 208 controls the operation of the reference generator 204 and the SDM ADC 206, in one embodiment. The control logic 208 inputs a clock signal ("Clock"), as well as various control signals ("Control"). In one embodiment, SDM ADC 206 updates Temp<n−1,0> once each clock cycle. However, a different update rate can be used. In one embodiment, Temp<n−1,0> becomes more accurate with a greater number of clock cycles.

Figure 2:
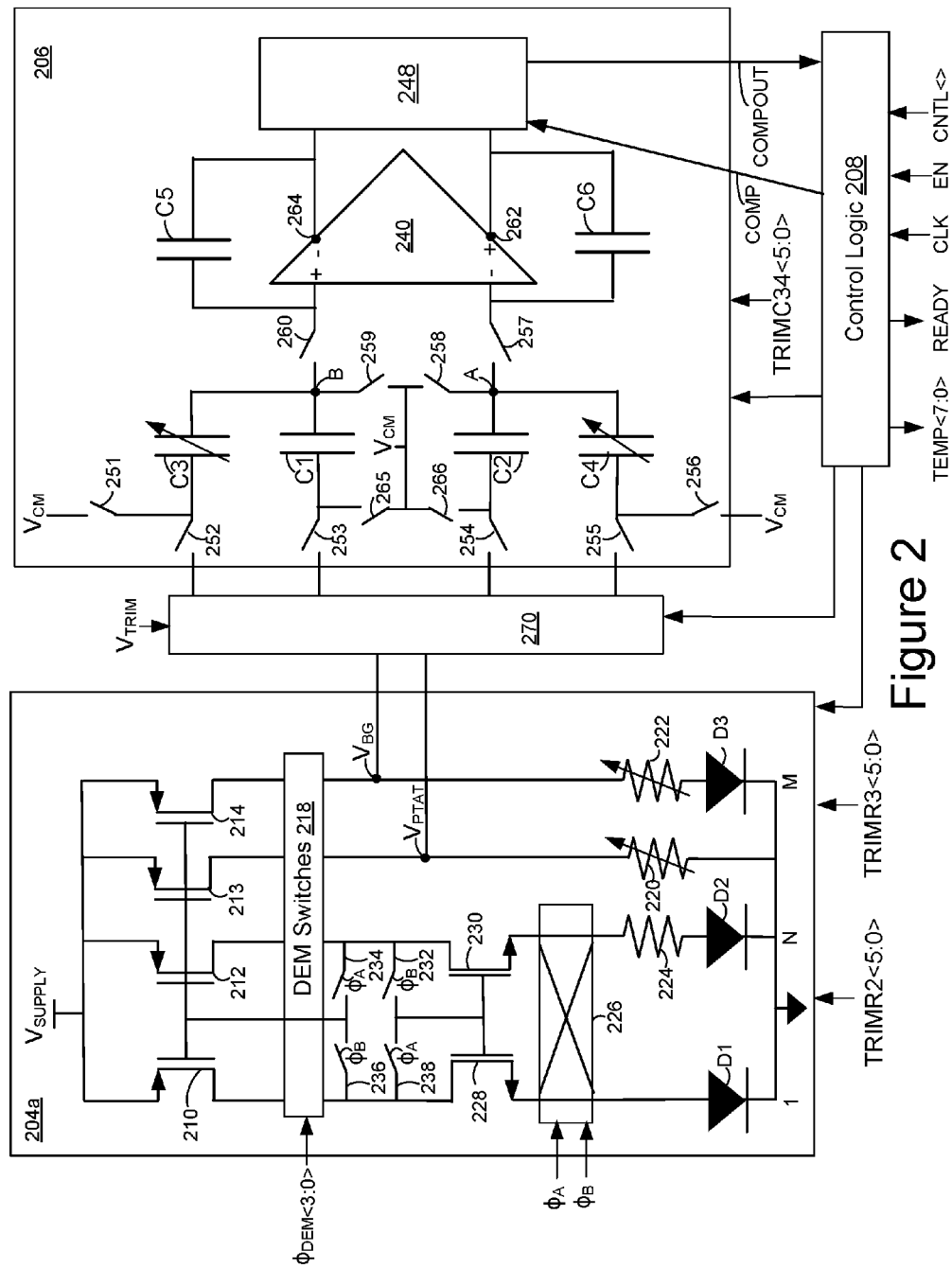
FIG. 2 shows one embodiment of a temperature sensor.

FIG. 2 shows one embodiment of a temperature sensor 142. This is one embodiment of the temperature sensor 142 of FIG. 1. The band gap circuit 204a is one embodiment of the reference generator 204 of FIG. 1. The SDM ADC 206 is one embodiment of the SDM ADC 206 of FIG. 1. Control logic 208 is one embodiment of control logic 208 of FIG. 1.

The band gap circuit 204a comprises diodes D1, D2 and D3. There is a 1:N ratio been diode D1 and diode D2. There is a 1:M ratio been diode D1 and diode D3. The cathodes of the three diodes D1, D2 and D3 are connected together. One side of variable resistor 220 is connected to the cathodes of diodes D1, D2 and D3. The diode cathodes are connected to ground, in one embodiment. The voltage at the other side of variable resistor 220 is $V_{PTAT}$. The anode of diode D3 is connected to one side of a variable resistor 222. The voltage at the other side of variable resistor 222 is a bandgap voltage $V_{BG}$. The anode of diode D2 is connected to one side of resistor 224.

The band gap circuit 204a also comprises transistors 210, 212, 213, and 214. In one embodiment, transistors 210, 212, 213, and 214 are MOSFETs. In this example, transistors 210, 212, 213, and 214 are PMOS transistors. The sources of transistors 210, 212, 213, and 214 are connected to a node that provides a supply voltage. The drains of transistors 210, 212, 213, and 214 are connected to DEM switches 218. It is possible for there to be some mismatch between transistors 210, 212, 213, and 214 due to, for example, process variation. The DEM switches 218 may be used to cancel such differences, as will be discussed below.

Figure 5:
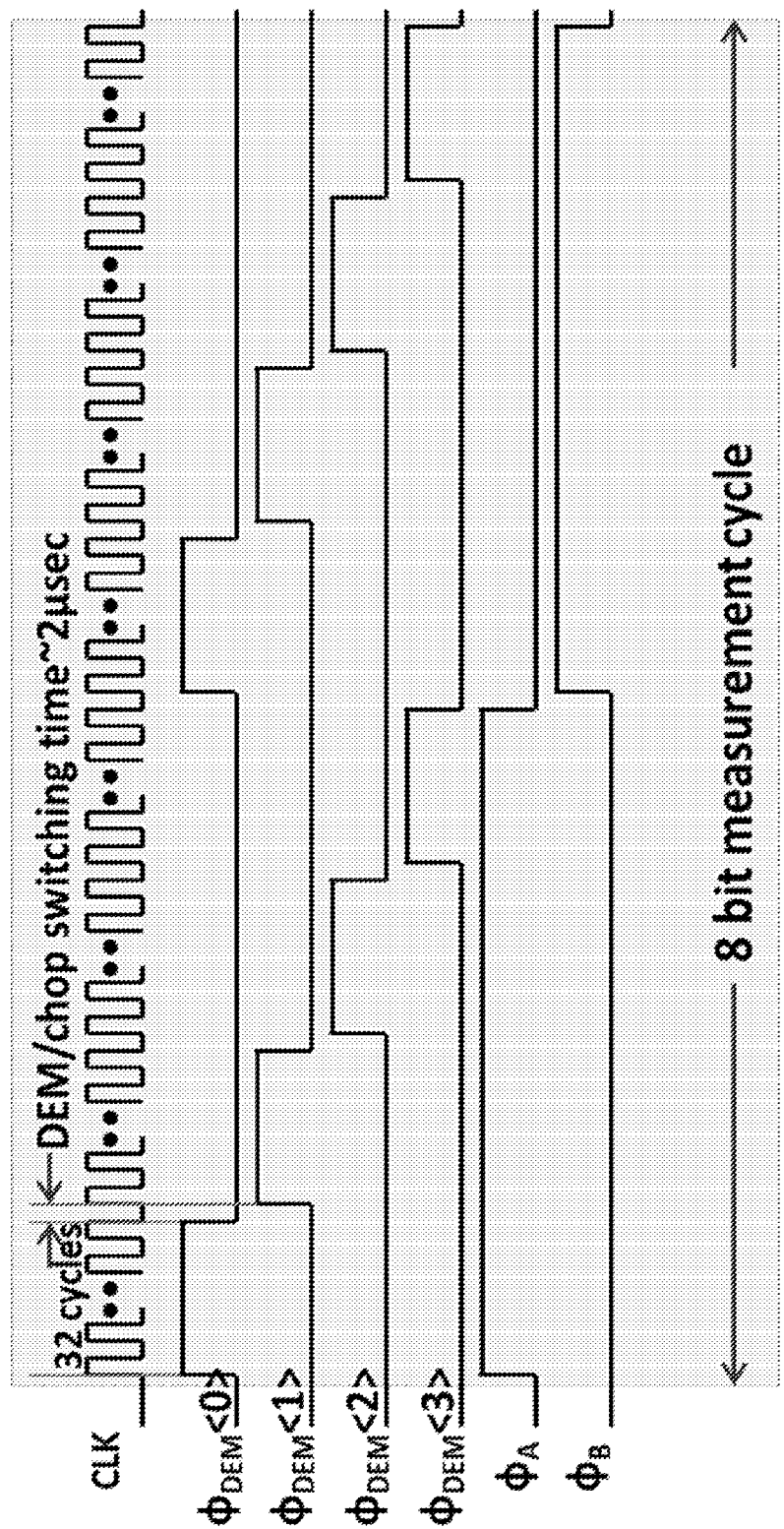
FIG. 5 shows one implementation of timing for signals φDEM<3:0> of FIG. 2.

The band gap circuit 204a also comprises transistors 228 and 230. In one embodiment, transistors 228 and 230 are MOSFETs. In this example, transistors 228 and 230 are NMOS transistors. The sources of transistors 228 and 230 are connected to switches 226. It is possible for there to be some mismatch between transistors 228 and 230 due to, for example, process variation. The switches 226 may be used to cancel such differences. In one embodiment, switches 226 are used to alternate which transistor (between 228 and 230) is connected to diode D1 and which is connected to resistor 224. At one point in time, the source of transistor 228 may be connected to the anode of diode D1 and the source of transistor 230 may be connected to resistor 224. At another point in time, the source of transistor 228 may be connected to resistor 224 and the source of transistor 230 may be connected to the anode of diode D1. The switches 226 may be controlled by signals φa and φb. FIG. 5 shows details of one embodiment of timing signals φa and φb. Signals φa and φb may also be used to control switches 232, 234, 236, and 238.

Switch 232 may be used to connect the drain of transistor 230 to the gates of transistors 228 and 230. This switch 232 is controlled by signal φb. Switch 234 may be used to connect the drain of transistor 230 to the gates of transistors 210, 212, 213, and 214. This switch 234 is controlled by signal 4a. Switch 238 may be used to connect the drain of transistor 228 to the gates of transistors 228 and 230. This switch 238 is controlled by signal 4a. Switch 236 may be used to connect the drain of transistor 228 to the gates of transistors 210, 212, 213, and 214. This switch 238 is controlled by signal φb.

As noted above, the DEM switches 218 may be used to provide offset cancellation for transistors 210, 212, 213, and 214. The DEM switches 218 may rotate which of the transistors 210, 212, 213, and 214 is connected to the following nodes: the drain of transistor 228, the drain of transistor 230, resistor 220, and resistor 222. At any one point in time, the source of each transistor 210, 212, 213, and 214 may be connected to one of these four nodes. The DEM switches 218 are controlled by signals φDEM<3:0>. FIG. 5 provides details for one embodiment of signals φDEM<3:0>.

FIG. 2 also shows one embodiment of an SDM ADC 206, as well as switches 270 between the band gap circuit 204a and the SDM ADC 206. The switches 270 may be used to control the inputs to the SDM ADC 206. During normal operation, the switches 270 may provide $V_{PTAT}$ and $V_{BG}$ as inputs to the SDM ADC 206. During at least a portion of a trimming operation, the switches 270 may provide $V_{TRiM}$ and $V_{BG}$ as inputs to the SDM ADC 206. The SDM ADC 206 is a first order, one bit SDM-ADC, in one embodiment.

The SDM ADC 206 includes a differential amplifier 240, six capacitors C1, C2, C3, C4, C5, and C6. Also included is comparison logic 248 and numerous switches 251-260. In one embodiment, capacitors C1 and C2 have the same capacitance. In one embodiment, capacitors C3 and C4 have the same capacitance. Note that capacitors C3 and C4 have a variable capacitance, in this embodiment. That is, the capacitance of capacitors C3 and C4 may be configured to a desired value. In one embodiment, capacitors C5 and C6 have the same capacitance.

In one embodiment, the magnitude of $V_{BG}$ is scaled by capacitors C1-C4. C1-C4 are one embodiment of a switched capacitor network. Scaling $V_{BG}$ may help to achieve a one degree Celsius step between each digital code that is output by the sensor 142, in one embodiment. The scaling may be used to achieve some other fixed amount of degrees Celsius between each digital code. In one embodiment, the magnitude of $V_{BG}$ is scaled by a "scaling factor" referred to as "K". As one example, to obtain a code of 1000_0000 at 85 degrees Celsius, the following expression may hold (for 85 degrees Celsius): $K^*V_{BG}=2(V_{PTAT}-V_{BG})$. A more general expression for the scaling factor K, in one embodiment, is: $K^*V_{BG}=(V_{PTAT}-V_{BG})^*RES^*(2^N)/(T_{TARG}-T_{MIN})$. In this equation, $T_{MIN}$ is the minimum temperature of measurement, $T_{TARG}$ is the target or trimming temperature, RES is a resolution in degrees Celsius per code, and N is the number of bits in the output temperature code. For example, if $T_{MIN}=-43$ degrees Celsius and $T_{TARG}$ is 21 degrees Celsius, then for a one degree Celsius resolution per code and an eight bit output code: $K^*V_{BG}=(V_{PTAT}-V_{BG})^*1^*(256)/(25-(-43))=4\ (V_{PTAT}-V_{BG})$. Thus, it may be stated that the scaling factor K depends on $(V_{PTAT}-V_{BG})/V_{BG}$. Note that $V_{BG}$ may also be referred to as a reference voltage. The dependency of the scaling factor K may be based on factors including, but not limited to, $T_{MIN}$, $T_{TARG}$, RES, and N. In one embodiment, the scaling factor is realized by the capacitor ratio: C3,4/C1,2=K. In this example, C3,4 refers to the capacitance of capacitors C3 and C4, which are the same in one embodiment. In this example, C1,2 refers to the capacitance of capacitors C1 and C2, which are the same in one embodiment.

Differential amplifier 240 is a fully differential amplifier in the embodiment of FIG. 2. The differential amplifier 240 may have a differential input between a non-inverting input and an inverting input. The differential amplifier 240 may have a differential output between the two output nodes 264, 262. Output 262 may produce an output voltage referred to as Vout+. Output 264 may produce an output voltage referred to as Vout−. The outputs 264, 262 are connected to the comparator logic 248, such that comparator logic 248 may be provided with Vout+ and Vout−. Note that using a fully differential amplifier may minimize charge injection and other common mode errors.

Capacitor C5 is connected between the non-inverting input and output 264 of the fully differential amplifier 240. Capacitor C6 is connected between the inverting input and output 262 of the fully differential amplifier 240. Capacitors C5 and C6 have the same capacitance, in one embodiment. Capacitors C5 and C6 have about the same capacitance as capacitors C1 and C2, in one embodiment. However, it is not required that C5 and C6 have about the same capacitance as capacitors C1 and C2. Capacitors C5 and C6 may be referred to as integrating capacitors.

Switch 260 is used to connect the non-inverting input of amplifier 240 to Node B. Switch 257 is used to connect the inverting input of amplifier 240 to Node A. Capacitors C1 and C3 each have one side connected to Node B. Capacitors C2 and C4 each have one side connected to Node A.

A common mode voltage ($V_{CM}$) is provided to several locations in the SDM ADC 206. Several of the switches connect various points in the SDM ADC 206 to a node that provides the common mode voltage. Switch 259 connects Node B to $V_{CM}$. Switch 258 connects Node A to $V_{CM}$. The side of the capacitor C3 that is not connected to Node B is switchably connectable to $V_{CM}$ using switch 251. The side of the capacitor C4 that is not connected to Node A is switchably connectable to $V_{CM}$ using switch 256. The side of the capacitor C1 that is not connected to Node B is switchably connectable to $V_{CM}$ using switch 265. The side of the capacitor C2 that is not connected to Node A is switchably connectable to $V_{CM}$ using switch 266.

Figure 6:
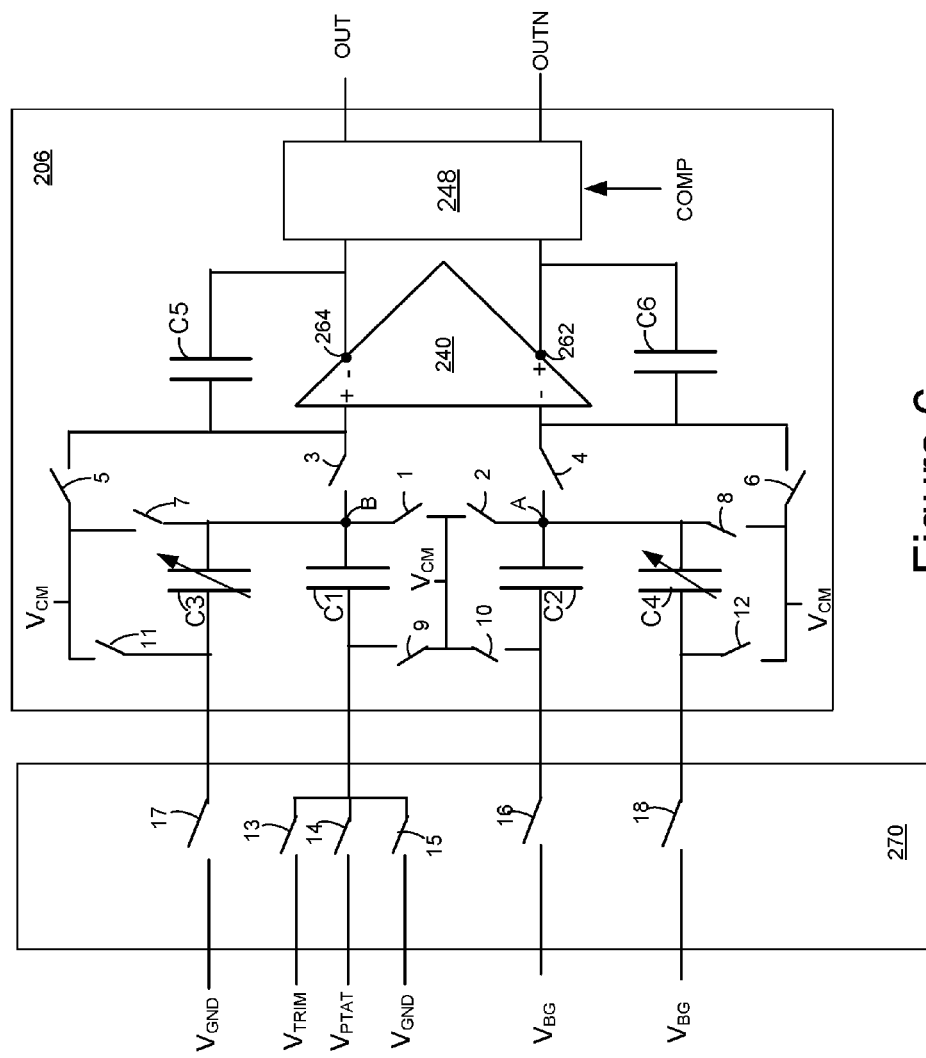
FIG. 6 is a diagram of one embodiment of switches 270 and SDM ADC 206 of FIG. 2.

The sides of the capacitors C1-C4 that are not connected to either Node A or B are also switchably connectable to switches 270. Switch 252 connects capacitor C3 to switches 270. Switch 253 connects capacitor C1 to switches 270. Switch 254 connects capacitor C2 to switches 270. Switch 255 connects capacitor C4 to switches 270. FIG. 6, to be discussed below, depicts details of one embodiment of switches 270.

FIG. 2 also depicts control logic 208. Control logic 208 provides a signal "COMP" to the comparator logic 248. COMP instructs the comparator logic 248 when to perform a comparison of its inputs, in one embodiment. For example, comparator logic 248 may compare the voltages at differential amplifier output nodes 264, 262. In one embodiment, this occurs once per clock cycle. The comparator logic 248 may store result of the comparison until the next time it performs a comparison. Control logic 208 receives a signal "COMPOUT" from the comparator logic 248. This is the result the comparator logic 248 was instructed to perform. COMPOUT may be referred to as a "comparison signal." Control logic 208 inputs a clock signal (CLK) and an enable signal (EN). Enable may be used to instruct the sensor 142 that it is to perform a temperature measurement.

Control logic 208 outputs one or more temperature codes. In one embodiment, control logic 208 has a counter that counts the ones in the COMPOUT signal in order to determine the temperature code. As one example, if the COMPOUT signal has an equal number of ones and zeros, this may corresponds to a middle code. A middle code refers to one half way between the lowest and highest digital code.

In this example, control logic 208 outputs temperature code TEMP<7:0>. Control logic 208 outputs ready signal READY to indicate that temperature code TEMP<7:0> is ready, in this embodiment. Temperature code TEMP<7:0> may be an eight bit temperature code. In one embodiment, there is a one degree Celsius step size between each value in the eight bit temperature code. However, there could be some other relationship, such as two degrees Celsius step size between each value in the eight bit temperature code, 0.5 degrees Celsius step size between each value in the eight bit temperature code, or some other amount of degrees Celsius step size between each value in the eight bit temperature code. It is not required that there be a fixed amount of degrees Celsius step size between each value in the eight bit temperature code.

Switches 270, switches 251-260, DEM switches 218, and switches 270 may be implemented in a variety of ways, including, but not limited to transistors. Control logic 208 may be implemented in any combination of hardware and/or software. Control logic 208 may include various elements including, but not limited to, a state machine, a processor, digital logic, analog components, an ASIC (Application Specific Integrated Circuit), RAM, and/or ROM. In one embodiment, the RAM, and/or ROM may contain instructions that may be executed on the processor. The instructions could be stored external to the control logic 208. However, it is not required for control logic 208 to be implemented by software. In one embodiment, control logic 208 is implemented entirely by hardware. In one embodiment, control logic 208 is implemented at least in part by state machine 112 (see FIG. 17). In one embodiment, control logic 208 is implemented at least in part by controller 122 (see FIG. 17). However, the control logic 208 is not limited to be implemented by components in the example memory device of FIG. 17.

In one embodiment, trimming of the sensor 142 is performed. In one embodiment, the trimming includes trimming the bandgap voltage (BG), trimming capacitors C3, C4, and trimming $V_{PTAT}$. The trimming takes place in that order, in one embodiment. In the example depicted in FIG. 2, a six bit trim code is used for each. The result of trimming the bandgap voltage (BG) may be trim code TRIMR3<5:0>. This trim code TRIMR3<5:0> may be used to trim the resistance of resistor 222. The result of trimming capacitors C3, C4 may be trim code TRIMC34<5:0>. This trim code TRIMC34<5:0> may be used to trim the capacitance of capacitors C3, C4. The result of trimming $V_{PTAT}$ may be trim code TRIMR2<5:0>. This trim code TRIMR2<5:0> may be used to trim the resistance of resistor 220.

Figure 3:
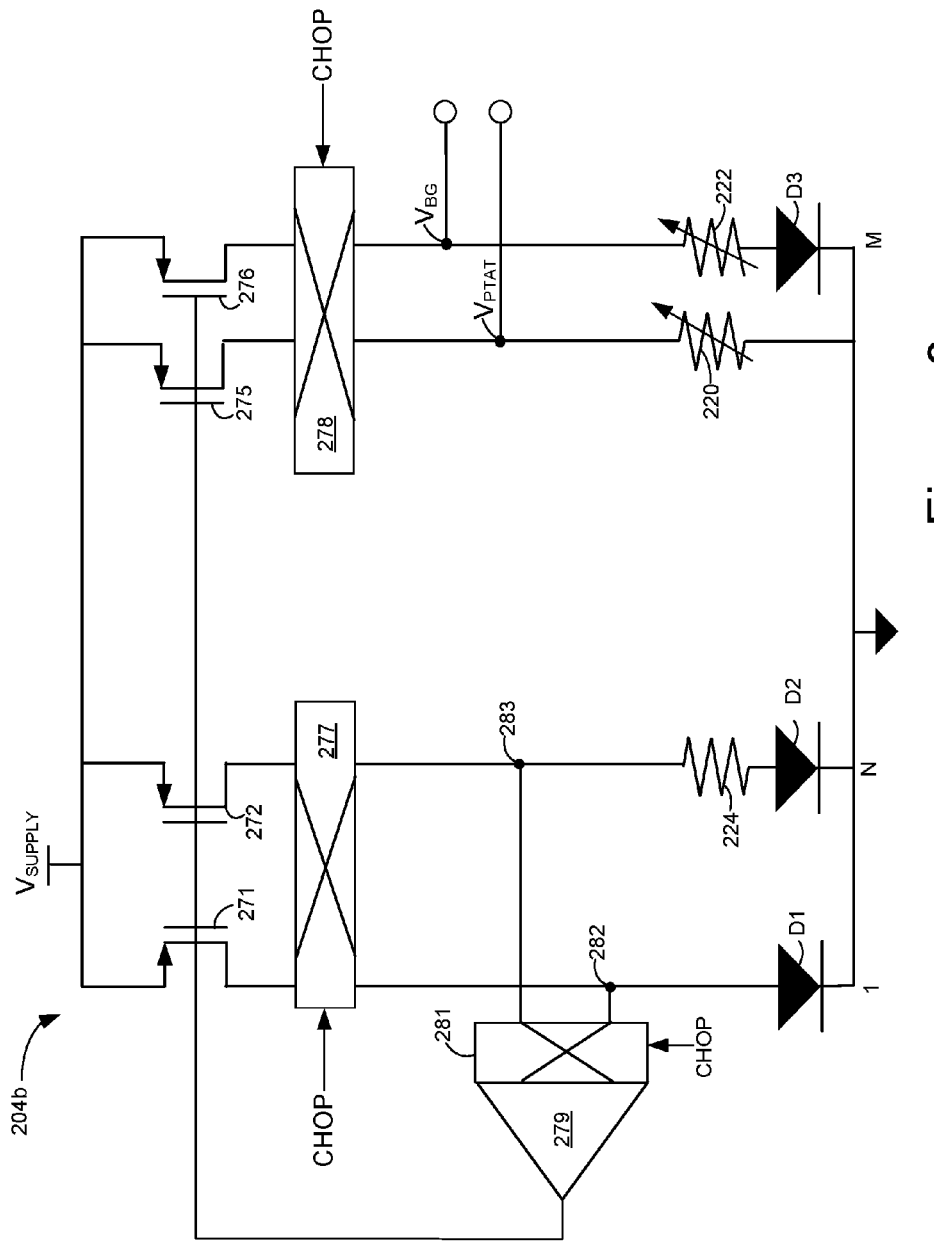
FIG. 3 is a diagram of a bandgap circuit, which is one embodiment of the reference generator of FIG. 1.

FIG. 3 is a diagram of a bandgap circuit 204b, which is another embodiment of the reference generator of FIG. 1. This bandgap circuit 204b is one embodiment of an offset compensated bandgap circuit. The bandgap circuit 204b may be used in the circuit of FIG. 2, in place of the bandgap circuit 204a. There are some elements in common with bandgap circuit 204a, hence some reference numerals in the two bandgap circuits 204a, 204b are the same. For example, each have diodes D1, D2 and D3, as well as resistors 220, 222, and 224. Note that some of the connections to these components may be different in the two circuits 204a, 204b.

Bandgap circuit 204b comprises transistors 271, 272, 275, 276. In one embodiment, transistors 271, 272, 275, 276 are MOSFETs. In this example, transistors 271, 272, 275, 276 are PMOS transistors. The sources of transistors 271, 272, 275, 276 are connected to a node that provides a supply voltage ($V_{SUPPLY}$). The drains of transistors 271-272 are connected to switches 277. The drains of transistors 275-276 are connected to switches 278.

Switches 278 are configured to rotate the connections of the drains of transistors 275 and 276 between resistors 220 and 222. Switches 278 are controlled by the signal "CHOP." In one embodiment, the signal "CHOP" is implemented with the signals φa and φb in FIG. 5.

Switches 277 are configured to rotate the connections of the drains of transistors 271-272 between the anode of diode D1 and resistor 224. At any one point in time, the drain of one of transistors 271-272 is connected to the anode of diode D1 and the drain of the other of transistors 271-272 is connected to the node of resistor 224 that is not connected to diode D2. Switches 277 may be controlled by the signal "CHOP." In one embodiment, the timing for the signal "CHOP" is implemented with the signals φa and φb in FIG. 5.

The bandgap circuit 204b also has an amplifier 279 with switches 281 at its input. The output of amplifier 279 is connected to the gates of transistors 271-276. In one embodiment, amplifier 279 has an inverting input and a non-inverting input (not depicted in FIG. 3). Switches 281 are connected between the inputs of amplifier 279 and two nodes 282 and 283 of the circuit 204b. The switches 281 are configured to rotate which node 282, 283 is connected to which input of the amplifier 279. Switches 281 are controlled by the signal "CHOP." In one embodiment, the signal "CHOP" is implemented with the signals φa and φb in FIG. 5.

Figure 4:
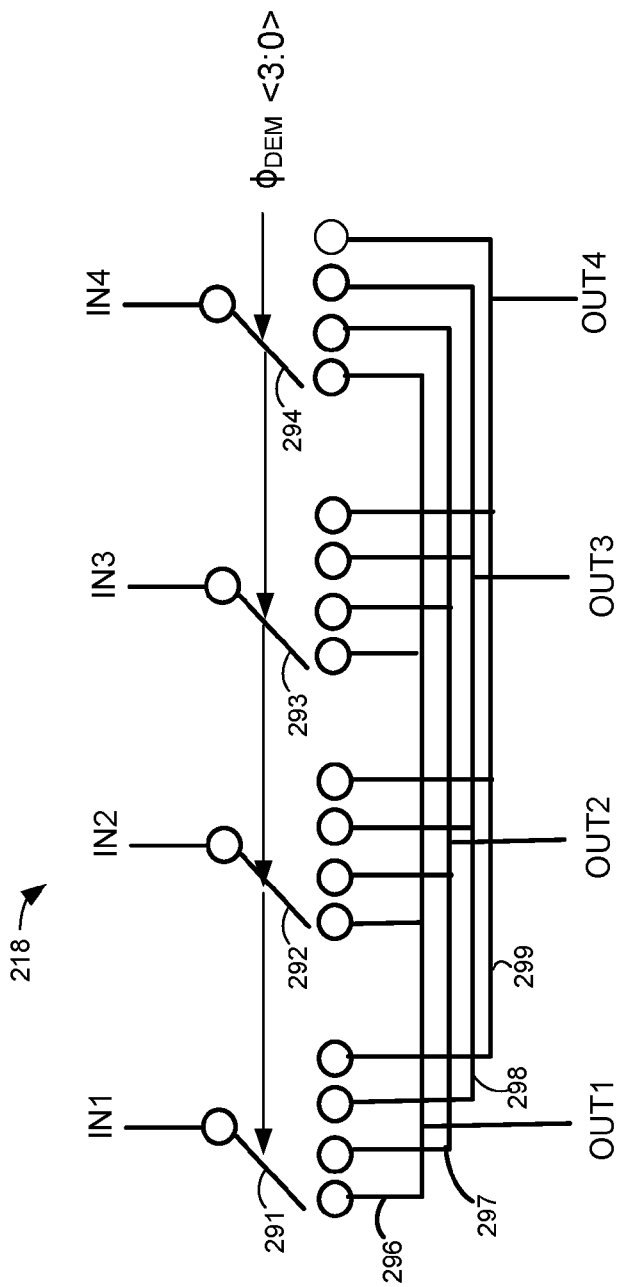
FIG. 4 is a diagram of one embodiment of the DEM switches 218 in the BG circuit 204*a* of FIG. 2.

FIG. 4 is a diagram that provides details of one embodiment of the DEM switches 218 in the BG circuit 204a of FIG. 2. The DEM switches 218 have four inputs (IN1, IN2, IN3, and IN4) and four outputs (OUT1, OUT2, OUT3, and OUT4). There are four switches 291-294. Switch 291 is connected to IN1, switch 292 is connected to IN2, switch 293 is connected to IN3, and switch 294 is connected to IN4. There are four connecting lines 296-299. OUT1 is connected to connecting line 296, OUT2 is connected to connecting line 297, OUT3 is connected to connecting line 298, and OUT4 is connected to connecting line 299.

The signal φDEM<3:0> controls operation of switches 291-294. At any one point in time, each input is connected to one output. The signal φDEM<3:0> rotates which connecting line 296-299 each of the switches 291-294 is connected to. Thus, the inputs (IN1-IN4) are rotated between the various outputs (OUT1-OUT4). FIG. 5 shows one implementation of timing for signals φDEM<3:0>.

In one embodiment, IN1 is connected to the drain of transistor 210 (see FIG. 2), IN2 is connected to the drain of transistor 212 (see FIG. 2), IN3 is connected to the drain of transistor 213 (see FIG. 2), and IN4 is connected to the drain of transistor 214 (see FIG. 2). In one embodiment, OUT1 is connected to the drain of transistor 228 (see FIG. 2), OUT2 is connected to the drain of transistor 230 (see FIG. 2), OUT3 is connected to resistor 220 (see FIG. 2), and OUT4 is connected to resistor 222 (see FIG. 2).

FIG. 5 is a timing diagram of one embodiment of the signals for the DEM switches 218 and switches 226 in the BG circuit 204a of FIG. 2. The signals for the DEM switches 218 are labeled φDEM<3:0>. The signals for the switches 226 are labeled φa, φb. Also shown is a clock signal (CLK). This may be the clock (CLK) that is input to control logic 208 in FIG. 2.

As can be seen, at most one of the φDEM signals is high at one time. There is a gap between φDEM<0> and φDEM<1>. In this example, the time gap is 2 microseconds, but this is implementation dependent. In this example, φDEM<0> is high for about 32 clock cycles. The other φDEM signals (1, 2, 3) are also high for about 32 clock cycles.

Only one of signals φa, φb are high at one time. The signal φa is high for about 128 clock cycles. Note that this corresponds to the time for each of φDEM<0> to φDEM<3> to go high once. There is a gap between φa goes low and φb goes high. The signal φb is high for about 128 clock cycles. Note that this corresponds to the time for each of φDEM<0> to φDEM<3> to go high once.

In one embodiment, a fast measurement of the temperature code is produced based on the output of the SDM-ADC after 32 clock cycles. This may be a lower resolution temperature code, such as a 5 bit digital code. In one embodiment, a higher resolution measurement of the temperature code (relative to the fast measurement) is produced based on the output of the SDM-ADC after 128 clock cycles. This higher resolution temperature code, could be an 8 bit digital code. This is further expanded upon below.

In one embodiment, the signals in FIG. 5 are used for bandgap circuit 204b in FIG. 3. Note that signals φa, φb may be used for "CHOP" in FIG. 3.

Note that the bandgap circuit 204a (FIG. 2) and the bandgap circuit 204b (FIG. 3) are two embodiments for achieving offset compensation. In these two examples, chopping/DEM was used. Other techniques can be used for achieving offset compensation in the reference generator 204. In one embodiment, auto-zeroing is used in the reference generator 204. In one embodiment, continuous time offset cancellation is used. Any combination of chopping/DEM, auto-zeroing and continuous time offset cancellation may be used in the reference generator 204.

FIG. 6 is a diagram that provides details of one embodiment of switches 270 and SDM ADC 206. Switches 270 may be used in the sensor 142 of FIG. 2. SDM ADC 206 includes differential amplifier 240, comparator 248, capacitors C1-C6, and switches 1-12. Switches 270 include switches 13-18. Note that the SDM ADC 206 of FIG. 6 may in principle be the same as the one of FIG. 2. However, for ease of explanation, the switches are shown and labeled differently. Note that the SDM ADC 206 of FIG. 6 may be used in place of the SDM ADC 206 that is depicted in FIG. 2. FIGS. 8C, 8D, 8F, 8G, 9C, 9D, 9F, 9G, 10C, 10D, 10F, and 10G show further details operation of switches 270 and SDM ADC 206 of FIG. 6.

The comparator 248 receives a signal "COMP", which instructs comparator 248 when to perform a comparison of the voltage at node 264 with the voltage at node 262. The comparator 248 outputs a signal on OUT and OUTN. OUT and OUTN are compliments, in one embodiment. For example, when OUT=1, OUTN=0, in one embodiment. In one embodiment, the number of "1s" at the OUT are counted to determine the temperature code.

Figure 7:
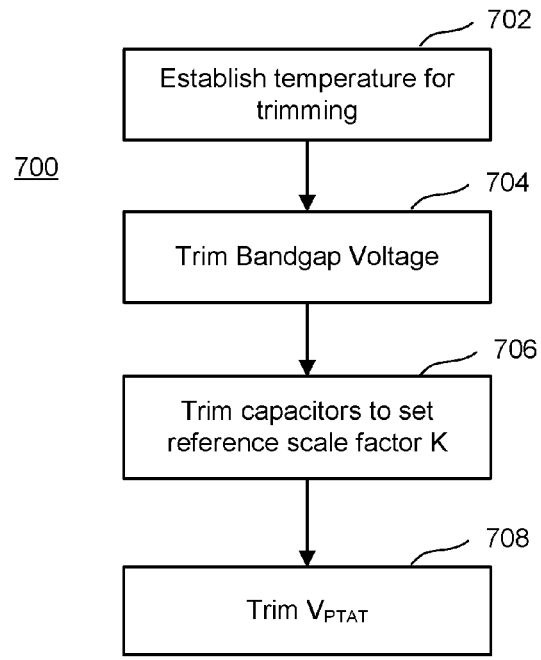
FIG. 7 is one embodiment of a flowchart of a process of trimming a temperature sensor.

FIG. 7 is one embodiment of a flowchart of a process 700 of trimming a temperature sensor. The process 700 may be used to trim the temperature sensor of FIG. 2, but is not limited to that example. In step 702, a temperature for trimming is established. This temperature is used throughout process 700. Thus, the process uses a single temperature for trimming the temperature sensor. Note that when there is no offset in the reference generator 204 and the SDM ADC 206, then high accuracy can be obtained with trimming at just one temperature. In one embodiment, the temperature is achieved by placing the device containing the temperature sensor into a chamber having a controlled temperature.

In step 704, the bandgap voltage is trimmed. In one embodiment, resistor 222 of either FIG. 2 or 3 is trimmed. In step 706, capacitors are trimmed to set the reference scale factor K. In one embodiment, capacitors C3 and C4 of either FIG. 2 or 6 are trimmed. In step 708, $V_{PTAT}$ is trimmed. In one embodiment, resistor 220 of either FIG. 2 or 3 is trimmed. Note that in one embodiment, steps 704, 706, and 708 are performed in the order: step 704, step 706, then step 708.

Figure 8A:
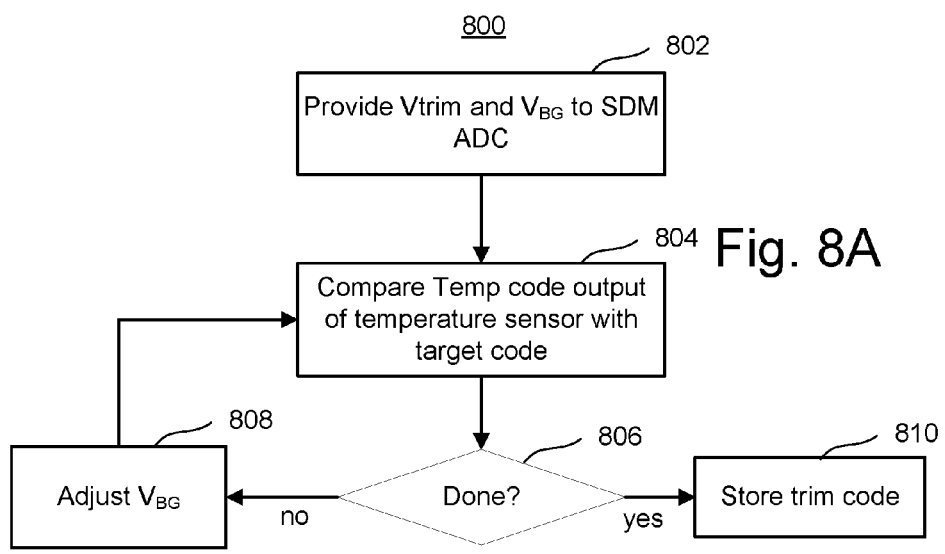
FIG. 8A is a flowchart of a process of trimming a bandgap voltage.

FIG. 8A is a flowchart of a process 800 of trimming a bandgap voltage. This is one embodiment of step 704 in FIG. 7. Process 800 may trim the bandgap voltage by trimming resistor 222 in FIG. 2 or 3. However, this is just one example. Other components could be trimmed. For example, the diode D3 in FIG. 2 or 3 could be trimming by adding or subtracting diodes in parallel with diode D3. Note that process 800 involves using an SDM ADC 206, such as the one depicted in FIG. 2 or 6.

In step 802, a trim voltage ($V_{TRIM}$) and the bandgap voltage are provided to the SDM ADC 206. In one embodiment, $V_{TRIM}$ has a magnitude that is based on the target value for the bandgap voltage. In one embodiment, $V_{TRIM}=\frac{1}{2} V_{BG(target)}$. For example, $V_{TRIM}$ might be 1.8V and $V_{BG(target)}$ might be 1.2V. In this case, the goal of process 800 may be to adjust $V_{BG}$ (in the bandgap circuit 204a, 204b) until the temperature code that is output by the temperature sensor reaches a "half code" that is midway between the lowest and highest temperature code.

The comparator 248 may then produces an output (e.g., COMPOUT) based on the input to the SDM ADC 206 (as processed by SDM ADC 206). Stated another way, the comparator 248 may produce the output by comparing the voltages at differential amplifier output nodes 264, 262. The temperature sensor may generate a temp code based on a count of ones in COMPOUT over some period of time. Note that COMPOUT may be based on OUT and OUTN in FIG. 6.

In step 804, the temp code output of the temperature sensor is compared to a target code. In one embodiment, the target code is a half code midway between the lowest and highest temperature code. For example, for an eight bit temperature code the half code may be 1000_0000. Note that in one embodiment, capacitors C1 and C2 are used, but capacitors C3 and C4 are not used.

In step 806 a determination is made whether the trimming process (of $V_{BG}$) is done. In one embodiment, this step concludes that the process is done when the temperature code hits the target code.

If the process is not done, then $V_{BG}$ is adjusted in step 808. There are numerous ways in which $V_{BG}$ may be adjusted. In one embodiment, the resistance of resistor 222 (see FIG. 2 or 3) is adjusted. In one embodiment, a current in the bandgap circuit is adjusted. For example, diode D3 (see FIG. 2 or 3) could be adjusted by adding or subtracting diodes in parallel with diode D3. In step 808, a working trim code is stored. This is based on the adjustment made in this step.

The process 800 then returns to step 804 to perform another comparison of the temperature code with the target code. Eventually when it is determined in step 806 that the trimming is complete, a trim code for trimming $V_{BG}$ is stored (in step 810).

In one embodiment, trimming $V_{BG}$ includes at least one sample phase, at least one integrate phase, and a compare phase. In one embodiment, the comparator 248 (see FIG. 2 or 6) compares the voltages at differential amplifier outputs 262 and 264 during the compare phase. After the comparison, the comparator 248 may hold the result until the next compare phase. In one embodiment, the number of sample and integrate phases may depend on the most recent value of the comparator 248.

Figure 8B:
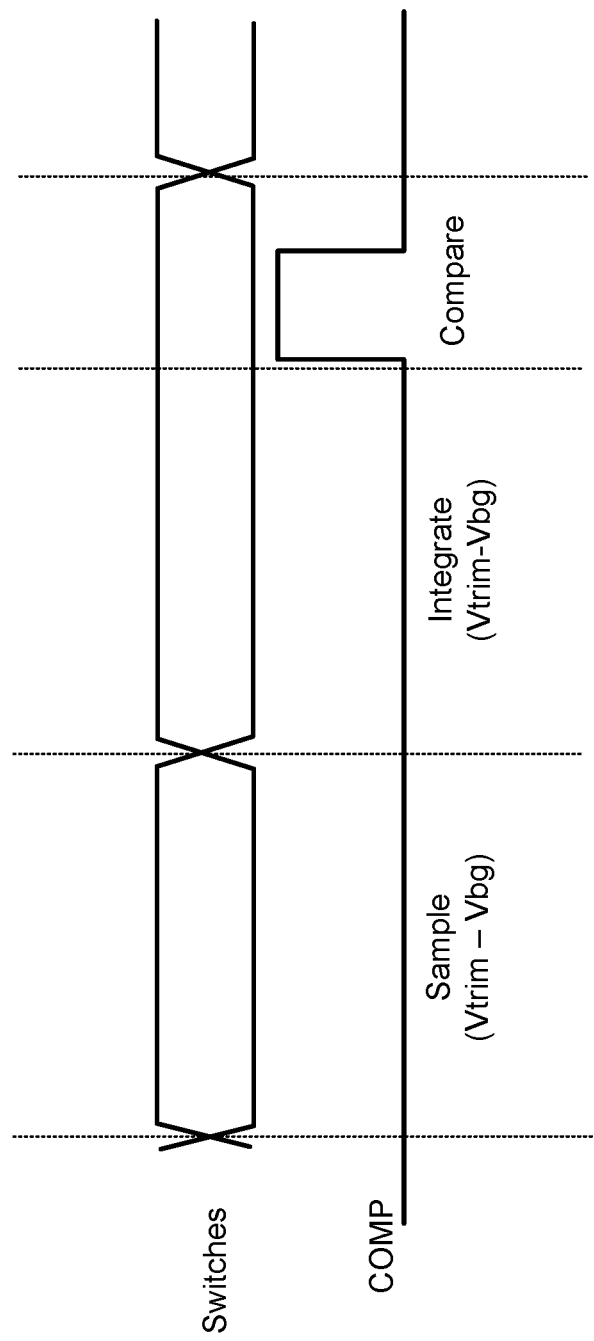
FIGS. 8B-8G are diagrams that illustrate switch operation in one embodiment of trimming a bandgap voltage.
Figure 8C:
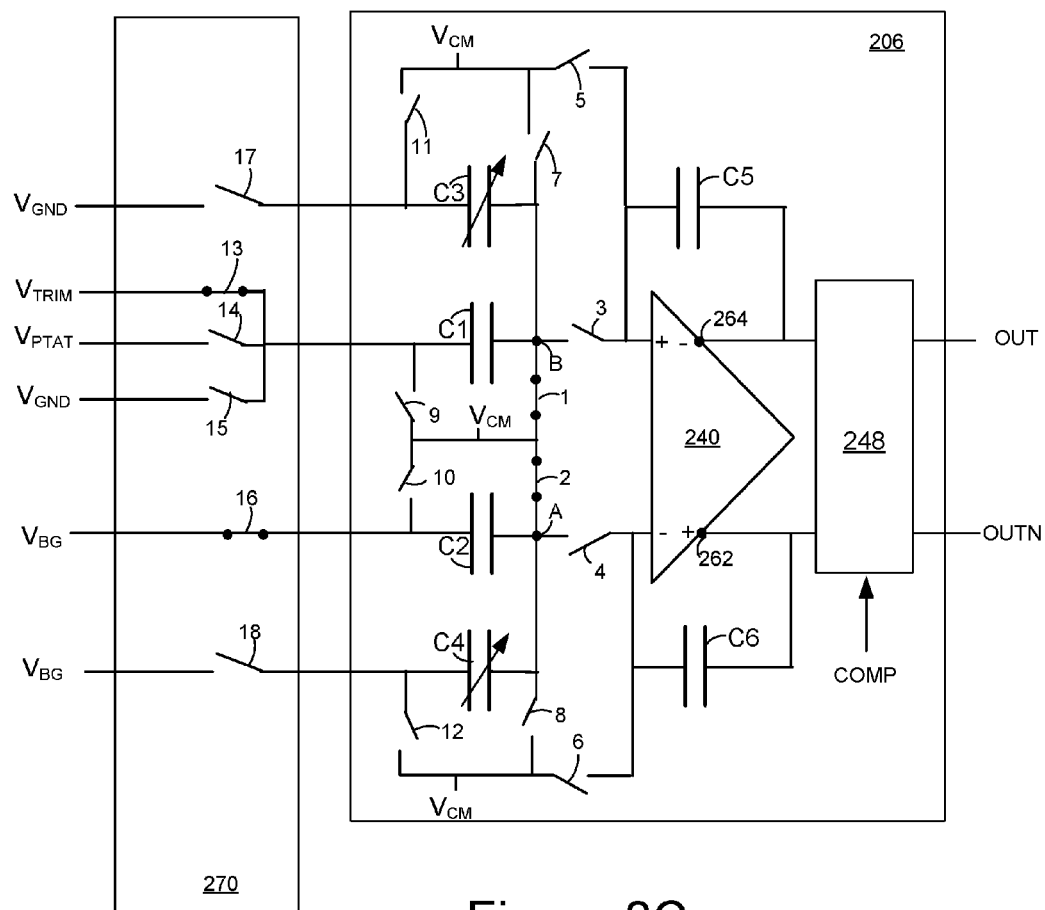
Figure 8D:
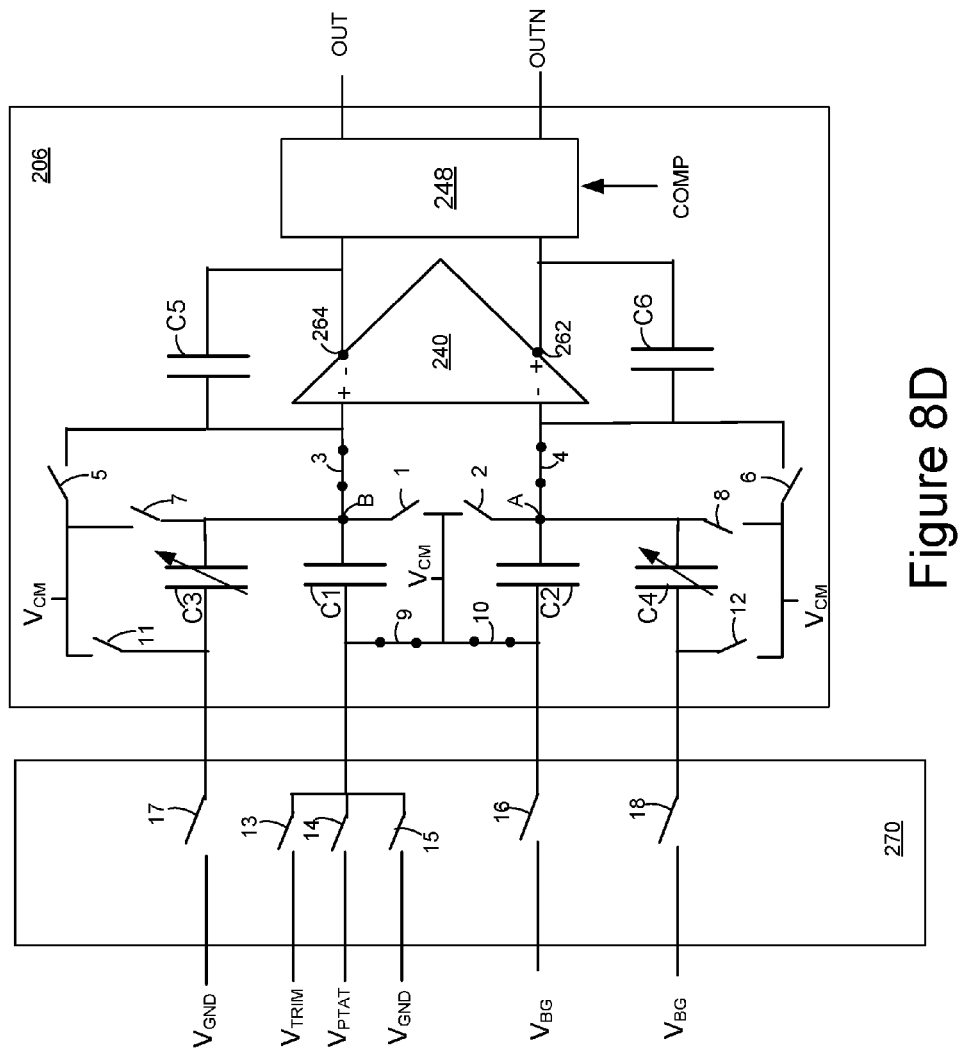
Figure 8E:
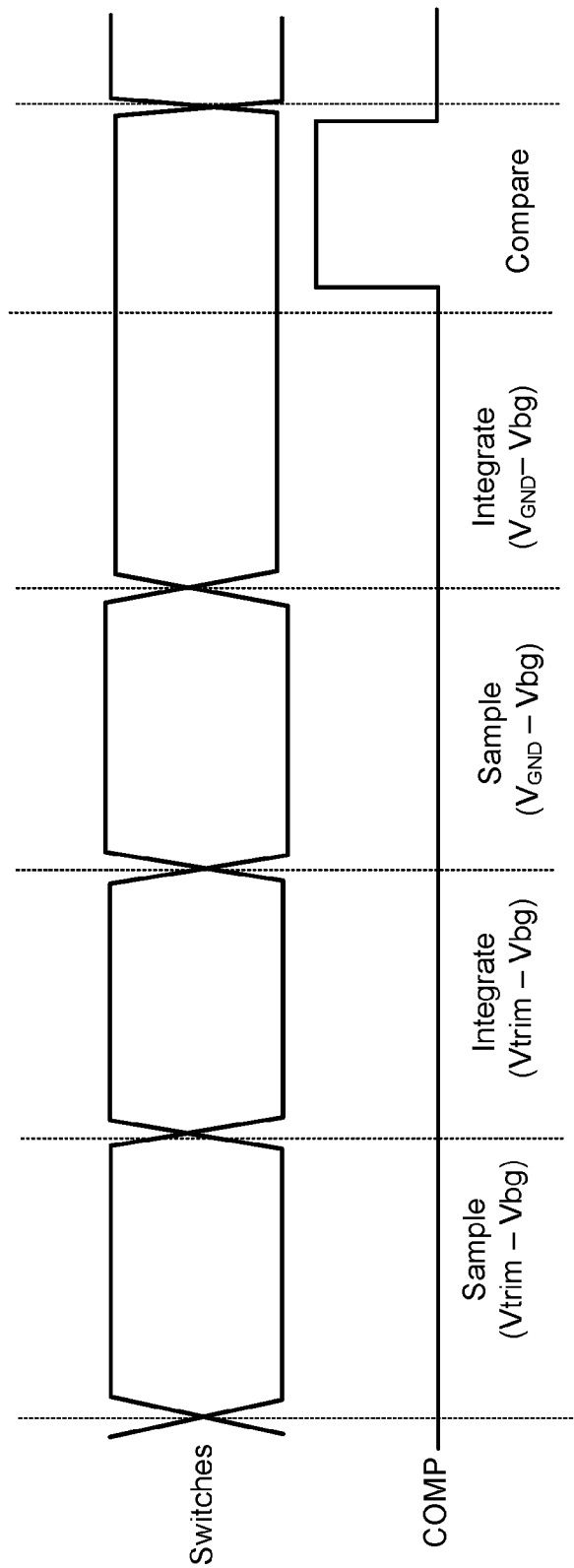
Figure 8F:
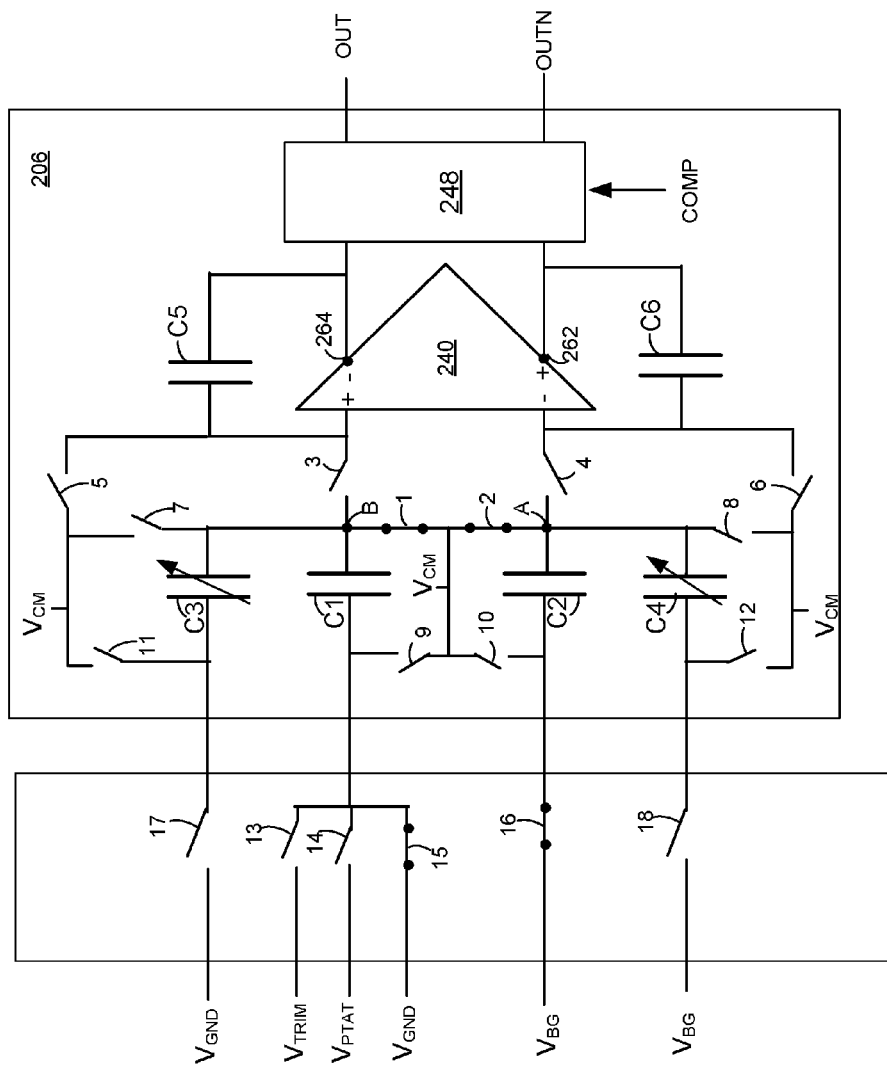
Figure 8G:
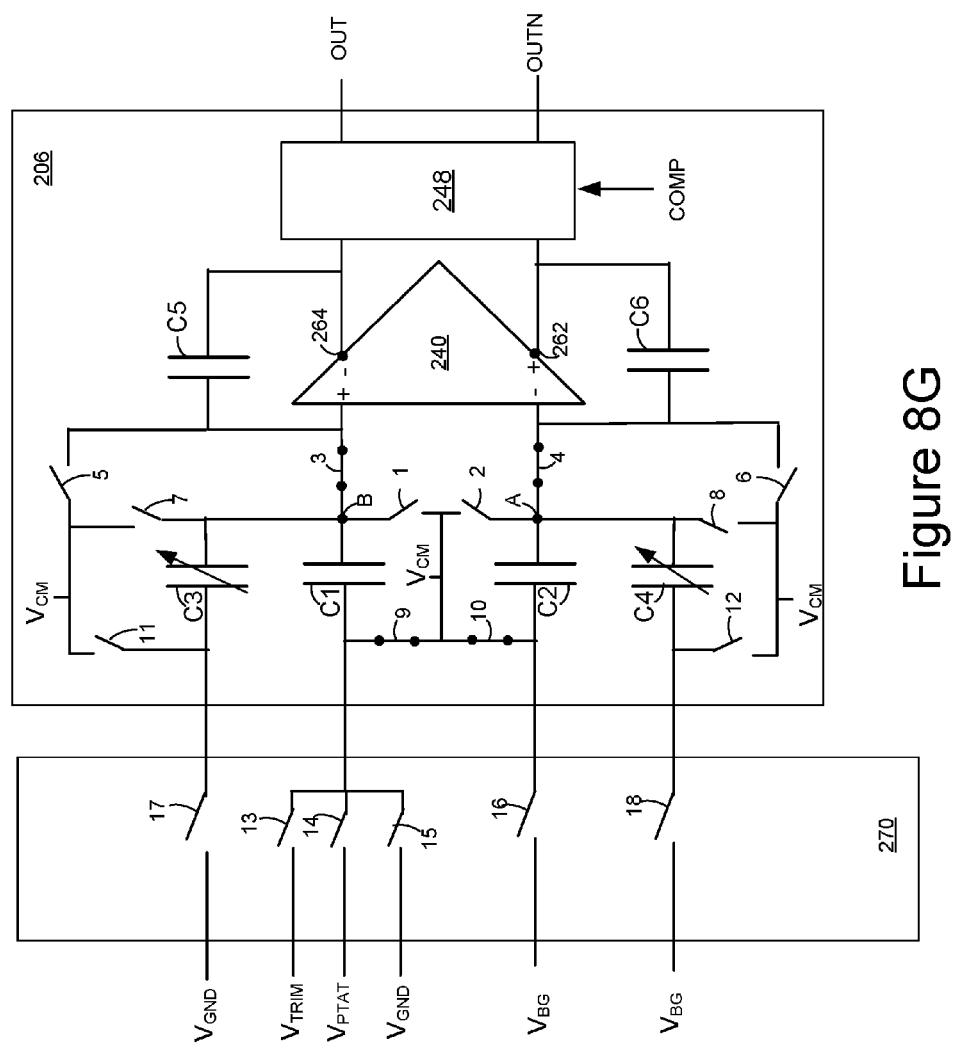

FIGS. 8B-8D refer to the case in which the most recent value of OUT=0 and OUTN=1 (this refers to the output of comparator 248 in FIG. 6). FIGS. 8E-8G refer to the case in which the most recent value of OUT=1 and OUTN=0.

FIG. 8B shows a timeline of these three phases. The switches in switches 270 and SDM ADC 206 may be established in one configuration during the sample phase and another configuration during the integration phase. Note that switches in switches 270 and SDM ADC 206 may remain in the same configuration for the compare phase as they were in the integration phase.

FIG. 8B also shows a signal "COMP", which is input to comparator 248. This signal indicates when the comparator 248 is active. Note that the comparator 248 is active only during the compare phase, in this embodiment. In one embodiment, the comparator 248 compares the voltages at nodes 262 and 264 during the compare phase. After the comparison, the comparator 248 may hold the result until the next compare phase. In one embodiment, the three phases in FIG. 8B occur during one clock cycle (e.g., one cycle of Clock in FIG. 1, CLK in FIG. 2, CLK in FIG. 5).

FIG. 8C is a diagram of one embodiment of the use of switches in the SDM ADC 206 and switches 270 of FIG. 6 during one embodiment of a sample phase of trimming $V_{BG}$ for the timeline in FIG. 8B. Note that capacitors C3 and C4 are not used in trimming $V_{BG}$, in this embodiment. The switches to be discussed refer to those in FIG. 8C and also in FIG. 6. Switch 13 is closed in order to provide $V_{TRIM}$ to capacitor C1. Switch 16 is closed in order to provide $V_{BG}$ to capacitor C2. Switch 1 is closed in order to connect $V_{CM}$ to the side of capacitor C1 that is not connected to $V_{TRIM}$. Switch 2 is closed in order to connect $V_{CM}$ to the side of capacitor C2 that is not connected to $V_{BG}$. Switches 3 and 4 are open. Hence, capacitor C1 is not connected to capacitor C5. Likewise, capacitor C2 is not connected to capacitor C6. Thus, during the sample phase of FIG. 8B, switches 1, 2, 13 and 16 are closed. All other switches (in switches 270 and SDM ADC 206 of FIGS. 6 and 8C) may be open. Note that the sample phase may be used during step 802 of FIG. 8A.

FIG. 8D is a diagram of one embodiment of the use of switches in the SDM ADC 206 and switches 270 of FIG. 6 during one embodiment of an integrate phase of trimming $V_{BG}$ for the timeline in FIG. 8B. Note that capacitors C3 and C4 are not used in trimming $V_{BG}$, in this embodiment. Switch 13 is open. Hence, $V_{TRIM}$ is not provided to capacitor C1. Switch 16 is open. Hence, $V_{BG}$ is not provided to capacitor C2. Switch 9 is closed in order to connect $V_{CM}$ to the side of capacitor C1 that is not connected to Node B. Switch 10 is closed in order to connect $V_{CM}$ to the side of capacitor C2 that is not connected to Node A. Switches 3 and 4 are closed. Hence, capacitor C1 is connected to capacitor C5 (as well as to the non-inverting input of amplifier 240). Likewise, capacitor C2 is connected to capacitor C6 (as well as to the inverting input of amplifier 240). Thus, during the integrate phase switches 3, 4, 9, and 10 are closed. All other switches (in switches 270 and SDM ADC 206) may be open. Note that the integrate phase may be used during step 802 of FIG. 8A.

FIGS. 8E-8G refer to the case in which the most recent value of OUT=1 and OUTN=0. FIG. 8E shows a timeline of with five phases which include: first sample phase, a first integrate phase, a second sample phase, a second integrate phase and a compare phase. The first sample phase involves $V_{TRIM}-V_{BG}$, in one embodiment. The first integrate phase involves $V_{TRIM}-V_{BG}$, in one embodiment. The second sample phase involves $V_{GND}-V_{BG}$, in one embodiment. The second integrate phase involves $V_{GND}-V_{BG}$, in one embodiment.

FIG. 8E also shows a signal "COMP", which is input to comparator 248. This signal indicates when the comparator 248 is active. Note that the comparator 248 is active only during the compare phase, in this embodiment. In one embodiment, the comparator 248 compares the voltages at nodes 262 and 264 during the compare phase. After the comparison, the comparator 248 may hold the result until the next compare phase. In one embodiment, the five phases in FIG. 8E occur during one clock cycle (e.g., one cycle of Clock in FIG. 1, CLK in FIG. 2, CLK in FIG. 5).

Since the first sample phase involves $V_{TRIM}-V_{BG}$, the switch operation may be the same as depicted in FIG. 8C. Since the first integrate phase involves $V_{TRIM}-V_{BG}$, the switch operation may be the same as depicted in FIG. 8D.

FIG. 8F is a diagram of one embodiment of the use of switches in the SDM ADC 206 and switches 270 of FIG. 6 during one embodiment of the second sample phase of trimming $V_{BG}$ for the timeline in FIG. 8E. Note that capacitors C3 and C4 are not used in trimming $V_{BG}$, in this embodiment. Switch 15 is closed in order to provide $V_{GND}$ to the side of capacitor C1 that is not connected to node B. Switch 16 is closed in order to provide $V_{BG}$ to the side of capacitor C2 that is not connected to Node A. Switch 1 is closed in order to connect $V_{CM}$ to the side of capacitor C1 that is connected to Node B. Switch 2 is closed in order to connect $V_{CM}$ to the side of capacitor C2 that is connected to Node A. Switches 3 and 4 are open. Hence, capacitor C1 is not connected to capacitor C5 or the differential amplifier 240. Likewise, capacitor C2 is not connected to capacitor C6 or the differential amplifier 240. Thus, during the sample phases switches 1, 2, 15 and 16 are closed. All other switches (in switches 270 and SDM ADC 206) may be open. Note that the second sample phase may be used during step 802 of FIG. 8A.

FIG. 8G is a diagram of one embodiment of the use of switches in the SDM ADC 206 and switches 270 of FIG. 6 during one embodiment of a second integrate phase of trimming $V_{BG}$ for the timeline in FIG. 8E. Note that capacitors C3 and C4 are not used in trimming $V_{BG}$, in this embodiment. Switch 15 is open. Hence, $V_{GND}$ is not provided to capacitor C1. Switch 16 is open. Hence, $V_{BG}$ is not provided to capacitor C2. Switch 9 is closed in order to connect $V_{CM}$ to the side of capacitor C1 that is not connected to Node B. Switch 10 is closed in order to connect $V_{CM}$ to the side of capacitor C2 that is not connected to Node A. Switches 3 and 4 are closed. Hence, capacitor C1 is connected to capacitor C5, as well as the non-inverting input of differential amplifier 240. Likewise, capacitor C2 is connected to capacitor C6, as well as the inverting input of differential amplifier 240. Thus, during the sample phases switches 3, 4, 9, and 10 are closed. All other switches (in switches 270 and SDM ADC 206) may be open.

Figure 9A:
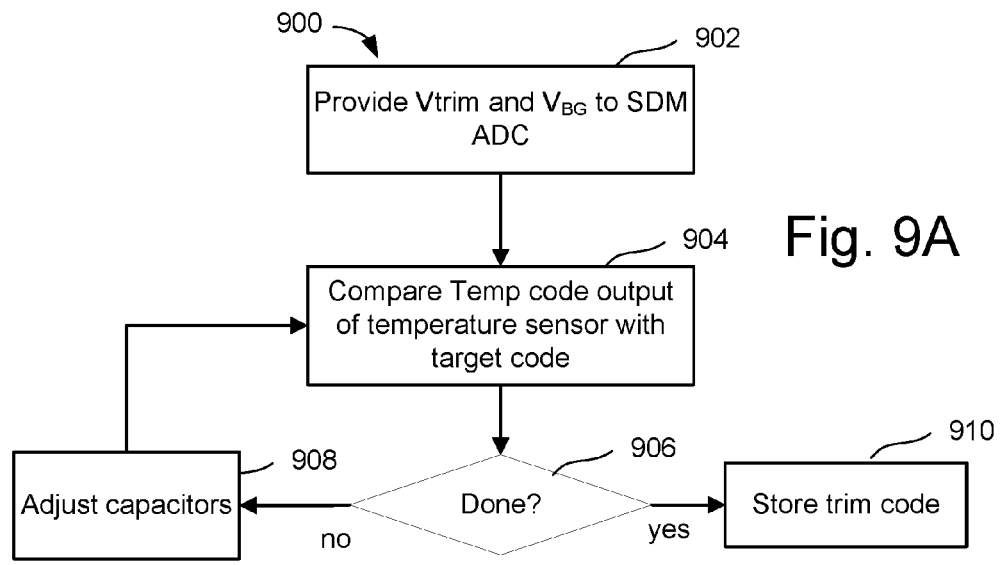
FIG. 9A is a flowchart of a process of trimming capacitors in SDM ADC.

FIG. 9A is a flowchart of a process 900 of trimming capacitors that are used to establish a K value. This is one embodiment of step 706 in FIG. 7. Note that this process is performed after the $V_{BG}$ has been trimmed, in one embodiment. In process 900, capacitors C1, C2, C3, and C4 are all used. Process 900 may be used to remove mismatches between capacitors C1, C2, C3, and C4. In one embodiment, process 900 trims capacitors C3 and C4 in FIG. 2. In one embodiment, process 900 trims capacitors C3 and C4 in FIG. 6.

In step 902, a trim voltage ($V_{TRIM}$) and the bandgap voltage are provided to the SDM ADC 206 (this might the SDM ADC 206 of FIG. 2 or 6). This step may be similar to step 802 from FIG. 8A. In one embodiment, $V_{TRIM}$ has a magnitude that is based on the target value for the bandgap voltage. In one embodiment, $V_{TRIM}-V_{BG(target)}=K/2 V_{BGtarget}$.

The comparator 248 may then produces an output (e.g., COMPOUT) based on the input to the SDM ADC 206. The temperature sensor may generate a temp code based on a count of ones in COMPOUT over some period of time.

In step 904, the temp code output of the temperature sensor is compared to a target code. In one embodiment, the target code is a half code midway between the lowest and highest temperature code. For example, for an eight bit temperature code the half code may be 1000_0000.

In step 906 a determination is made whether the trimming process (for the capacitors) is done. In one embodiment, this step concludes that the process is done when the temperature code hits the target code.

If the process 900 is not done, then the capacitors C3, C4 are adjusted in step 908. In step 908, a working trim code is stored. This is based on the adjustment made in this step.

The process 900 then returns to step 904 to perform another comparison of the temperature code with the target code. Eventually when it is determined in step 906 that the trimming is complete, a trim code is stored for the capacitors C3, C4 (in step 910).

In one embodiment, trimming of the capacitors C3 and C4 includes at least one sample phase, at least one integrate phase, and a compare phase. In one embodiment, the comparator 248 compares the voltages at nodes 262 and 264 during the compare phase. After the comparison, the comparator 248 may hold the result until the next compare phase.

Figure 9B:
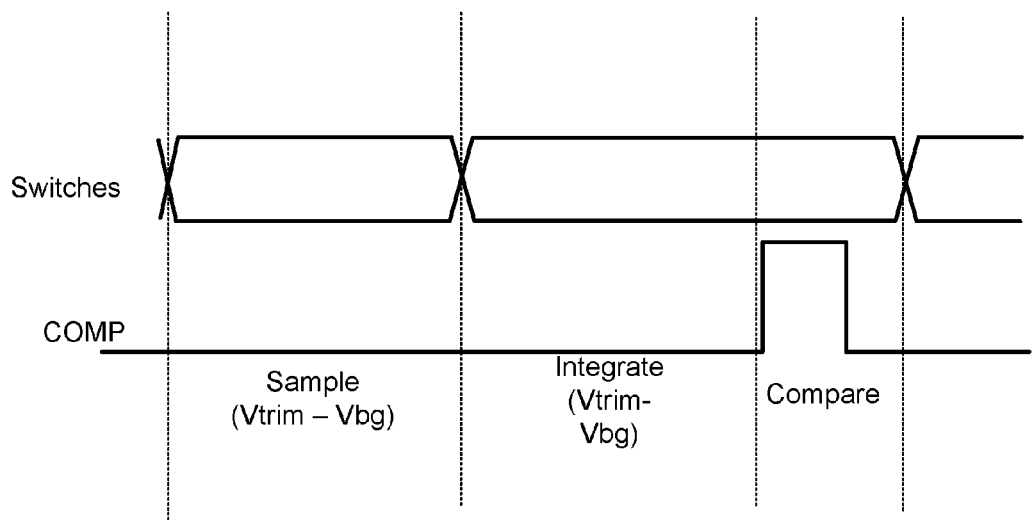
FIGS. 9B-9G are diagrams that illustrate switch operation in one embodiment of trimming capacitors in SDM ADC.
Figure 9C:
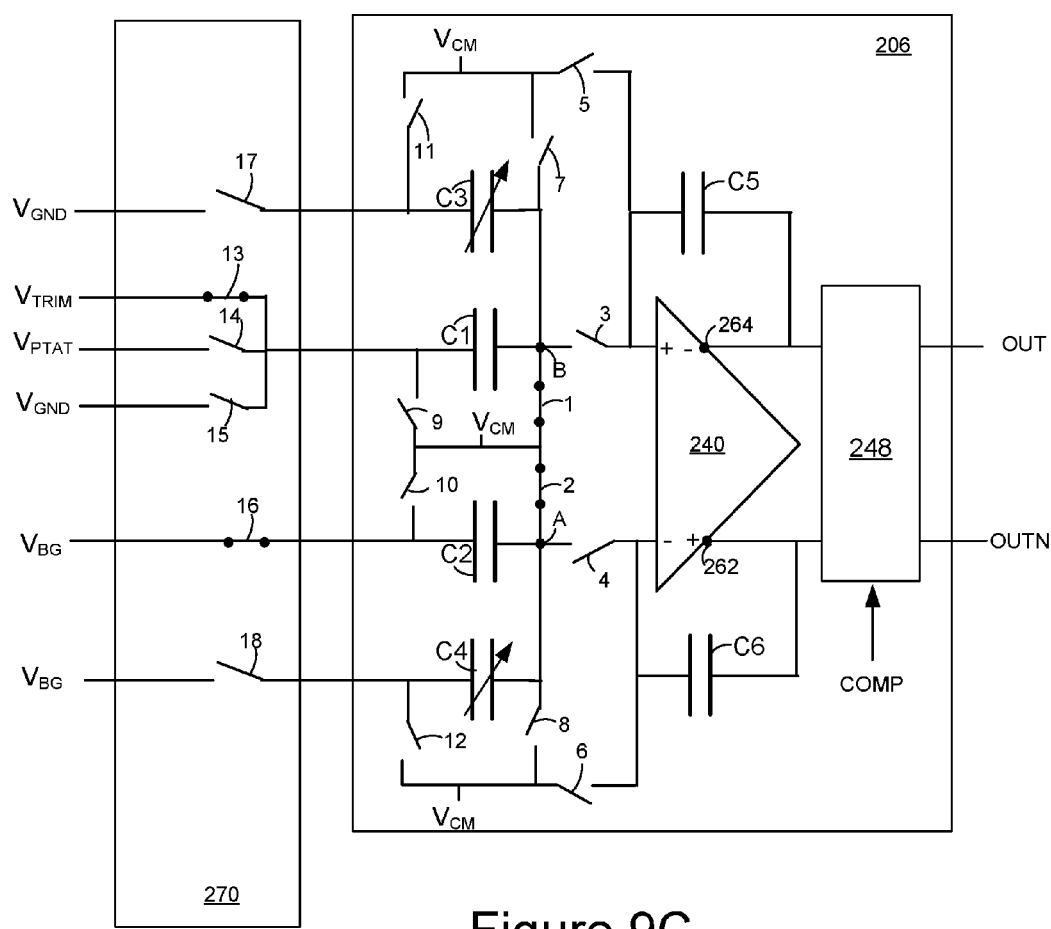
Figure 9D:
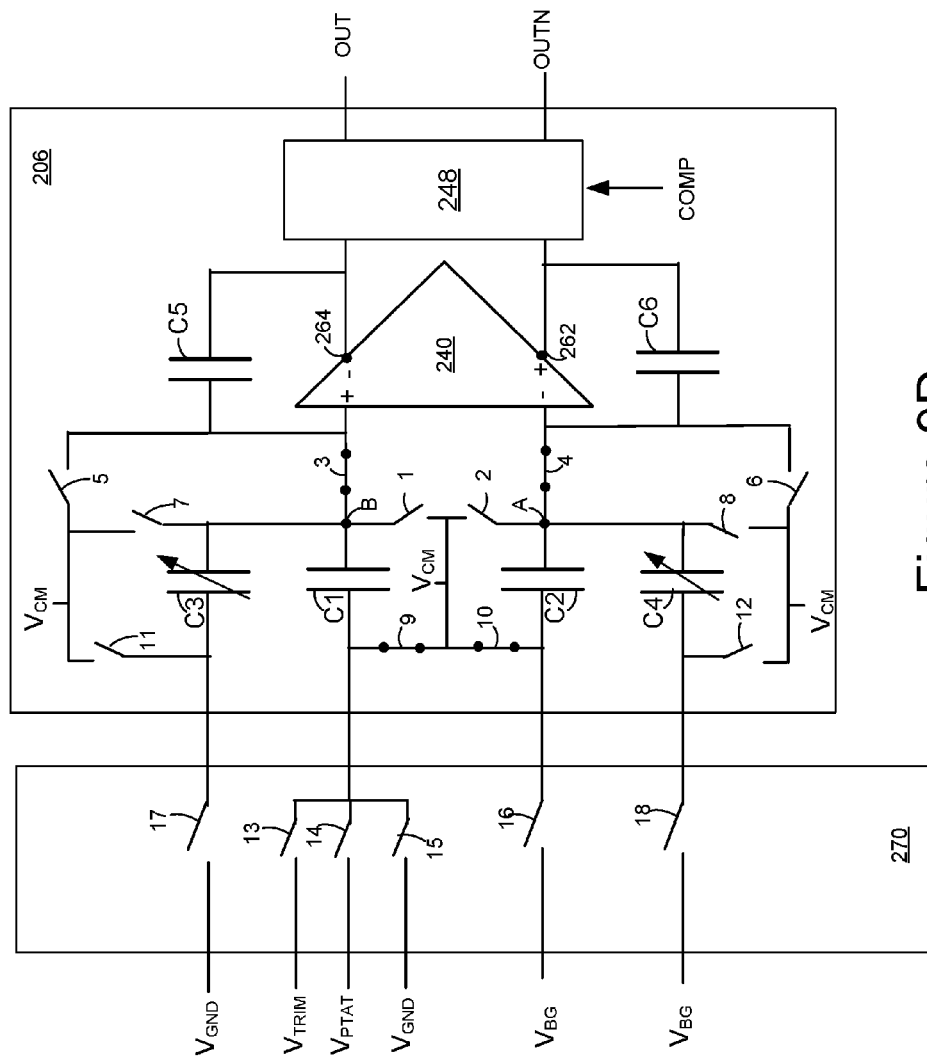
Figure 9E:
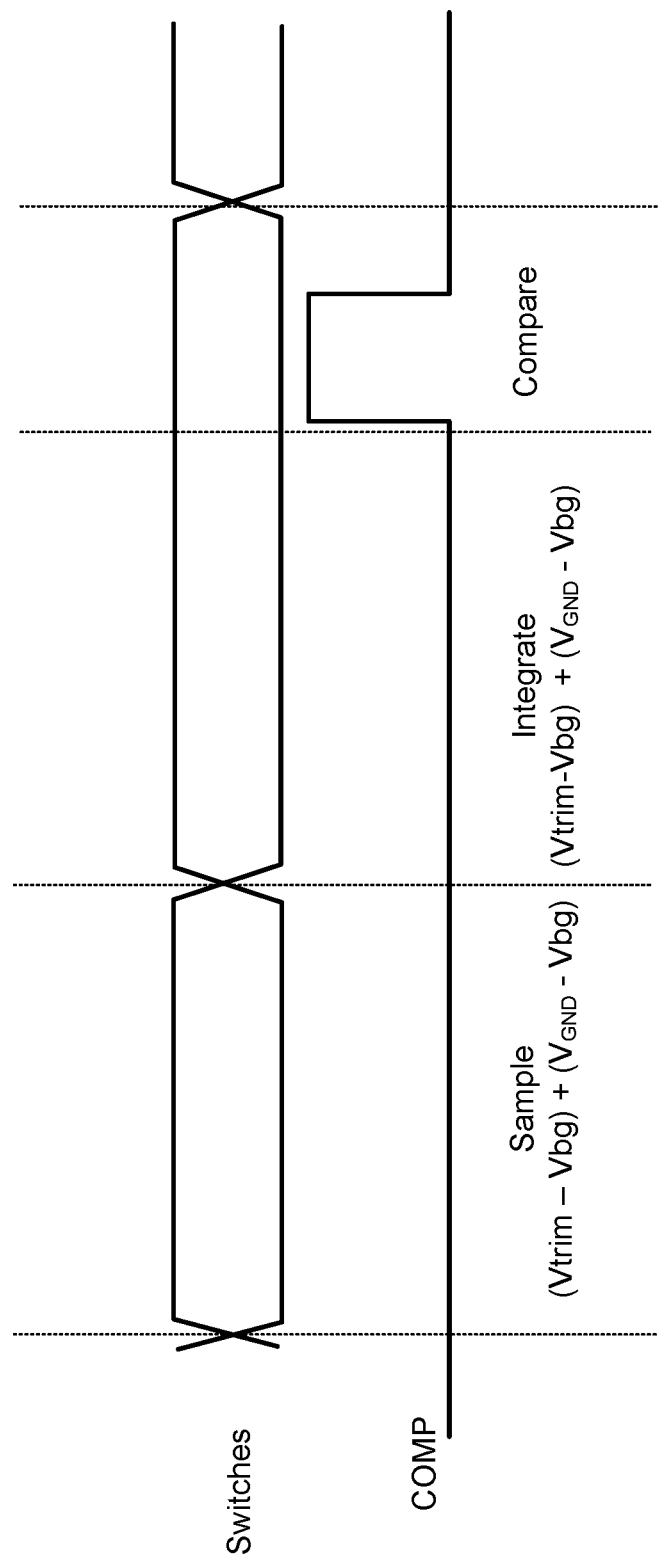
Figure 9F:
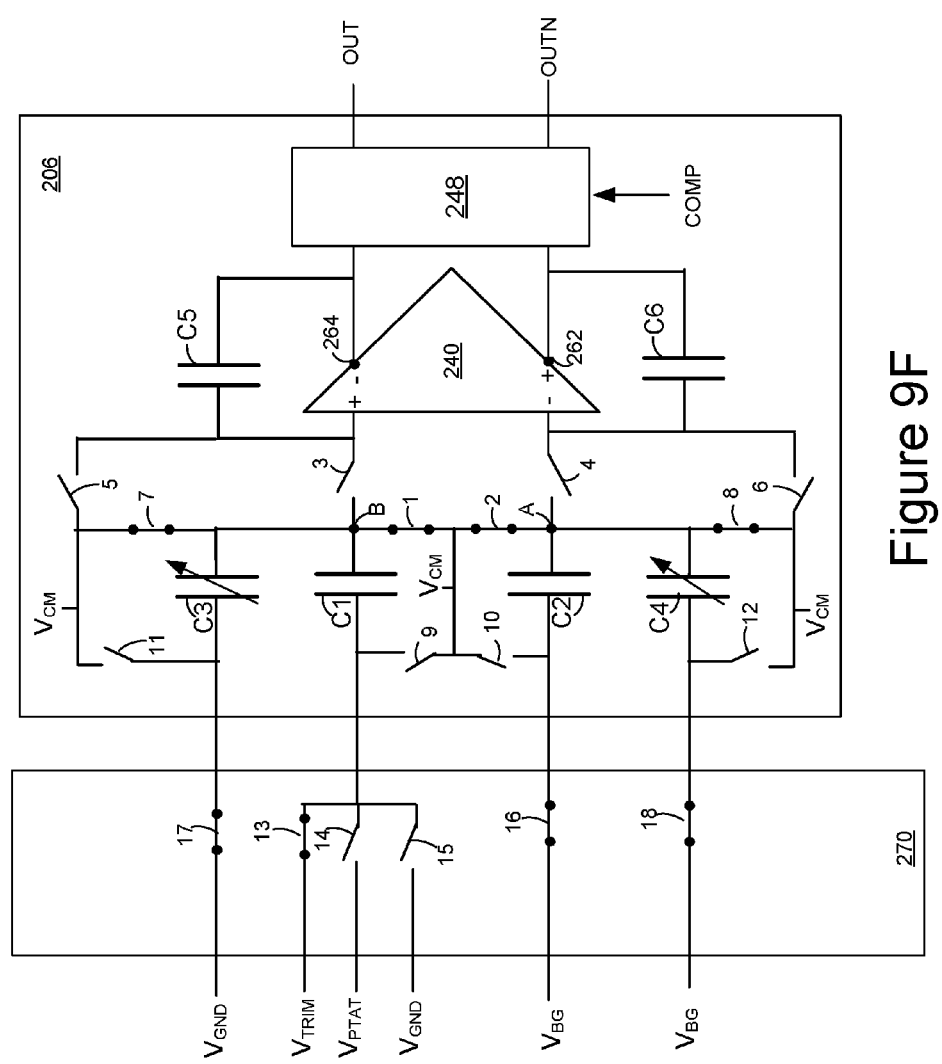
Figure 9G:
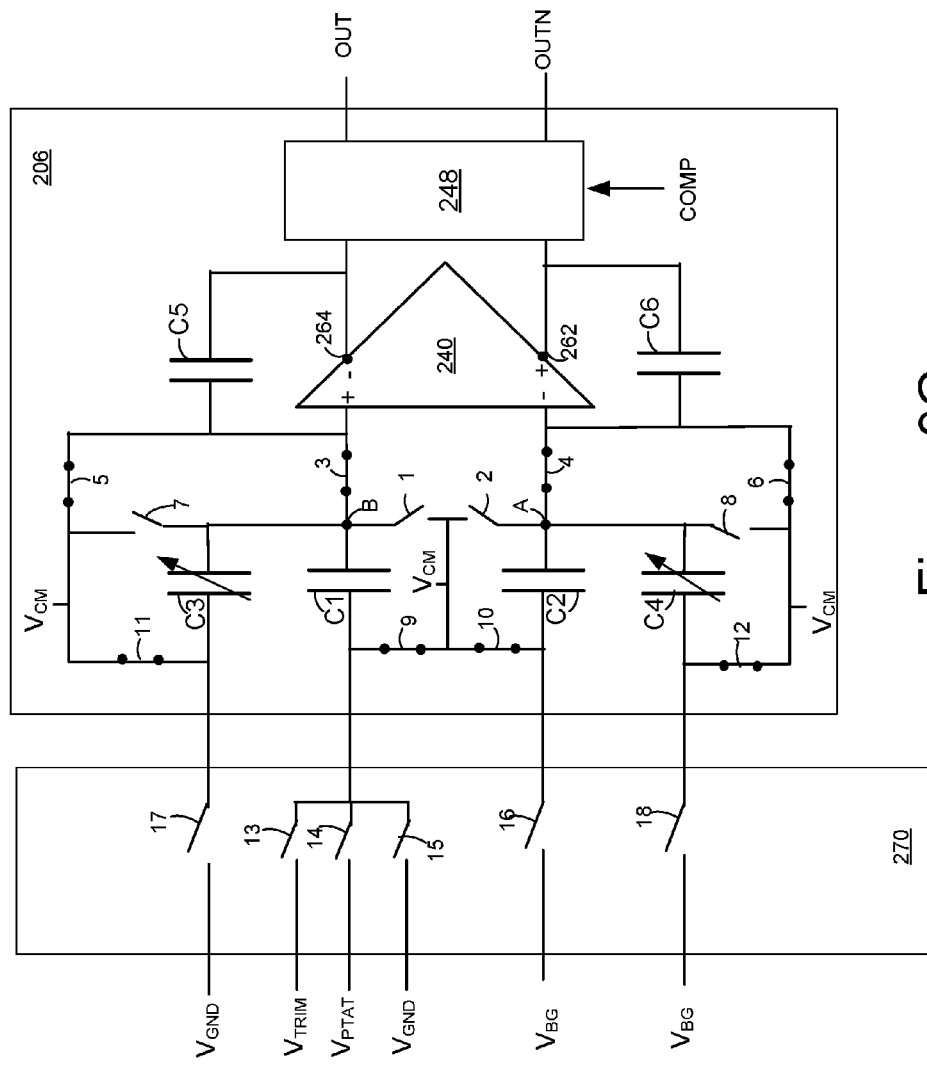

FIGS. 9B-9D refer to the case in which the most recent value of OUT=0 and OUTN=1. FIGS. 9E-9G refer to the case in which the most recent value of OUT=1 and OUTN=0.

FIG. 9B shows a timeline of these three phases for trimming the capacitors C3, C4. The switches in switches 270 and SDM ADC 206 may be established in one configuration during the sample phase and another configuration during the integration phase. Note that switches in switches 270 and SDM ADC 206 may remain in the same configuration for the compare phase as they were in the integration phase.

FIG. 9B also shows a signal "COMP", which is input to comparator 248. This signal indicates when the comparator 248 is active. Note that the comparator 248 is active only during the compare phase, in this embodiment. In one embodiment, the comparator 248 compares the voltages at nodes 262 and 264 during the compare phase. After the comparison, the comparator 248 may hold the result until the next compare phase. In one embodiment, the three phases in FIG. 9B occur during one clock cycle (e.g., one cycle of Clock in FIG. 1, CLK in FIG. 2, CLK in FIG. 5).

FIG. 9C is a diagram of one embodiment of the use of switches in the SDM ADC 206 and switches 270 of FIG. 6 during one embodiment of a sample phase of trimming capacitors C3 and C4 for the timeline in FIG. 9B. Switch 13 is closed in order to provide $V_{TRIM}$ to capacitor C1. Switch 16 is closed in order to provide $V_{BG}$ to capacitor C2. Switch 1 is closed in order to connect $V_{CM}$ to capacitor C1. Switch 2 is closed in order to connect $V_{CM}$ to capacitor C2. Switches 3 and 4 are open. Hence, capacitor C1 is not connected to capacitor C5. Likewise, capacitor C2 is not connected to capacitor C6. Thus, during the sample phases switches 1, 2, 13 and 16 are closed. All other switches (in switches 270 and SDM ADC 206) may be open. Note that the sample phase may be used during step 902 of FIG. 9A.

FIG. 9D is a diagram of one embodiment of the use of switches in the SDM ADC 206 and switches 270 of FIG. 6 during one embodiment of an integrate phase of trimming capacitors C3 and C4 for the timeline in FIG. 9B. Switch 13 is open. Hence, $V_{TRIM}$ is not provided to capacitor C1. Switch 16 is open. Hence, $V_{BG}$ is not provided to capacitor C2. Switch 9 is closed in order to connect $V_{CM}$ to capacitor C1. Switch 10 is closed in order to connect $V_{CM}$ to capacitor C2. Switches 3 and 4 are closed. Hence, capacitor C1 is connected to capacitor C5. Likewise, capacitor C2 is connected to capacitor C6. Thus, during the integrate phase switches 3, 4, 9, and 10 are closed. All other switches (in switches 270 and SDM ADC 206) may be open.

FIGS. 9E-9G refer to the case in which the most recent value of OUT=1 and OUTN=0. FIG. 9E shows a timeline of with phases which include: sample phase, integrate phase, and a compare phase.

FIG. 9E also shows a signal "COMP", which is input to comparator 248. This signal indicates when the comparator 248 is active. Note that the comparator 248 is active only during the compare phase, in this embodiment. In one embodiment, the comparator 248 compares the voltages at nodes 262 and 264 during the compare phase. After the comparison, the comparator 248 may hold the result until the next compare phase. In one embodiment, the three phases in FIG. 9E occur during one clock cycle (e.g., one cycle of Clock in FIG. 1, CLK in FIG. 2, or CLK in FIG. 5).

FIG. 9F is a diagram of one embodiment of the use of switches in the SDM ADC 206 and switches 270 of FIG. 6 during one embodiment of the sample phase of trimming capacitors C3 and C4 for the timeline in FIG. 9E. Switch 17 is closed in order to provide $V_{GND}$ to capacitor C3. Switch 13 is closed in order to provide $V_{TRIM}$ to capacitor C1. Switch 16 is closed in order to provide $V_{BG}$ to capacitor C2. Switch 18 is closed in order to provide $V_{BG}$ to capacitor C4. Switch 1 is closed in order to connect $V_{CM}$ to capacitor C1. Switch 2 is closed in order to connect $V_{CM}$ to capacitor C2. Switch 7 is closed in order to connect $V_{CM}$ to capacitor C3. Switch 8 is closed in order to connect $V_{CM}$ to capacitor C4.

Switches 3 and 4 are open. Hence, capacitor C1 is not connected to capacitor C5. Likewise, capacitor C2 is not connected to capacitor C6. Moreover, capacitor C3 is not connected to capacitor C5. Likewise, capacitor C4 is not connected to capacitor C6. Thus, during the sample phase switches 1, 2, 7, 8, 13, 16, 17, and 18 are closed. All other switches (in switches 270 and SDM ADC 206) may be open. Note that the sample phase may be used during step 902 of FIG. 9A.

FIG. 9G is a diagram of one embodiment of the use of switches in the SDM ADC 206 and switches 270 of FIG. 6 during one embodiment of an integrate phase of trimming capacitors C3 and C4. Switch 9 is closed in order to connect $V_{CM}$ to capacitor C1. Switch 10 is closed in order to connect $V_{CM}$ to capacitor C2. Switch 11 is closed in order to connect $V_{CM}$ to capacitor C2. Switch 12 is closed in order to connect $V_{CM}$ to capacitor C4. Switches 3 and 4 are closed. Hence, capacitor C1 is connected to capacitor C5. Likewise, capacitor C2 is connected to capacitor C6. Also, switches 5 and 6 are closed. Hence, capacitor C3 is connected to capacitor C5. Likewise, capacitor C4 is connected to capacitor C6.

Thus, during this integrate phase, switches 3, 4, 5, 6, 9, 10, 11 and 12 are closed. All other switches (in switches 270 and SDM ADC 206) may be open.

FIG. 10A is a flowchart of a process 1000 of trimming $V_{PTAT}$. This is one embodiment of step 708 in FIG. 7. Note that this process 1000 is performed after the $V_{BG}$ has been trimmed and after the capacitors C3 and C4 have been trimmed, in one embodiment. In process 1000, capacitors C1-C4 are all used. Process 1000 may be used to remove errors for $V_{PTAT}$.

In step 1002, the present value of $V_{PTAT}$ and the bandgap voltage are provided to the SDM ADC 206. In one embodiment, the present value of $V_{PTAT}$ is provided to the non-inverting input of differential amplifier 240 and the bandgap voltage is provided to the inverting input of differential amplifier 240. This step is different from step 802 of FIG. 8A (as well as step 922 of FIG. 9) in that $V_{PTAT}$ is used instead of $V_{TRIM}$. The comparator 248 then produces an output (e.g., COMPOUT) based on the input. The sensor may generate a temp code based on a count of ones in COMPOUT over some period of time.

In step 1004, the temp code output of the temperature sensor is compared to a target code. In one embodiment, the target code is a half code midway between the lowest and highest temperature code. For example, for an eight bit temperature code the half code may be 1000_0000.

In step 1006 a determination is made whether the trimming process (for $V_{PTAT}$) is done. In one embodiment, this step concludes that the process is done when the temperature code hits the target code.

If the process 1000 is not done, then $V_{PTAT}$ is adjusted in step 1008. In one embodiment, the resistance of resistor 220 in FIG. 2 is adjusted to adjust $V_{PTAT}$. In step 1008, a working trim code is stored for $V_{PTAT}$. This is based on the adjustment made in this step.

The process 1000 then returns to step 1004 to perform another comparison of the temperature code with the target code. Eventually when it is determined in step 1006 that the trimming is complete, a trim code is stored for $V_{PTAT}$ (in step 1010.)

In one embodiment, trimming of $V_{PTAT}$ includes at least one sample phase, at least one integrate phase, and a compare phase. In one embodiment, the comparator 248 compares the voltages at nodes 262 and 264 during the compare phase. After the comparison, the comparator 248 may hold the result until the next compare phase.

Figure 10C:
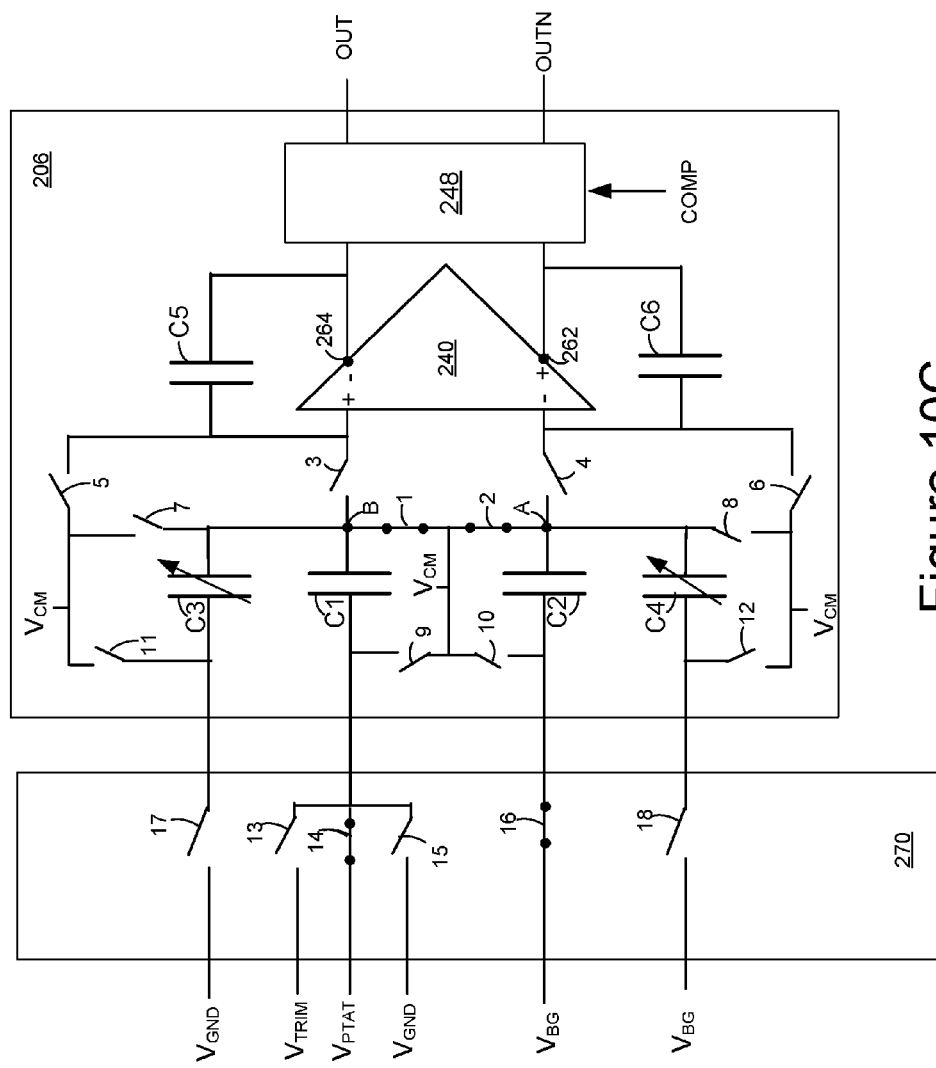
Figure 10D:
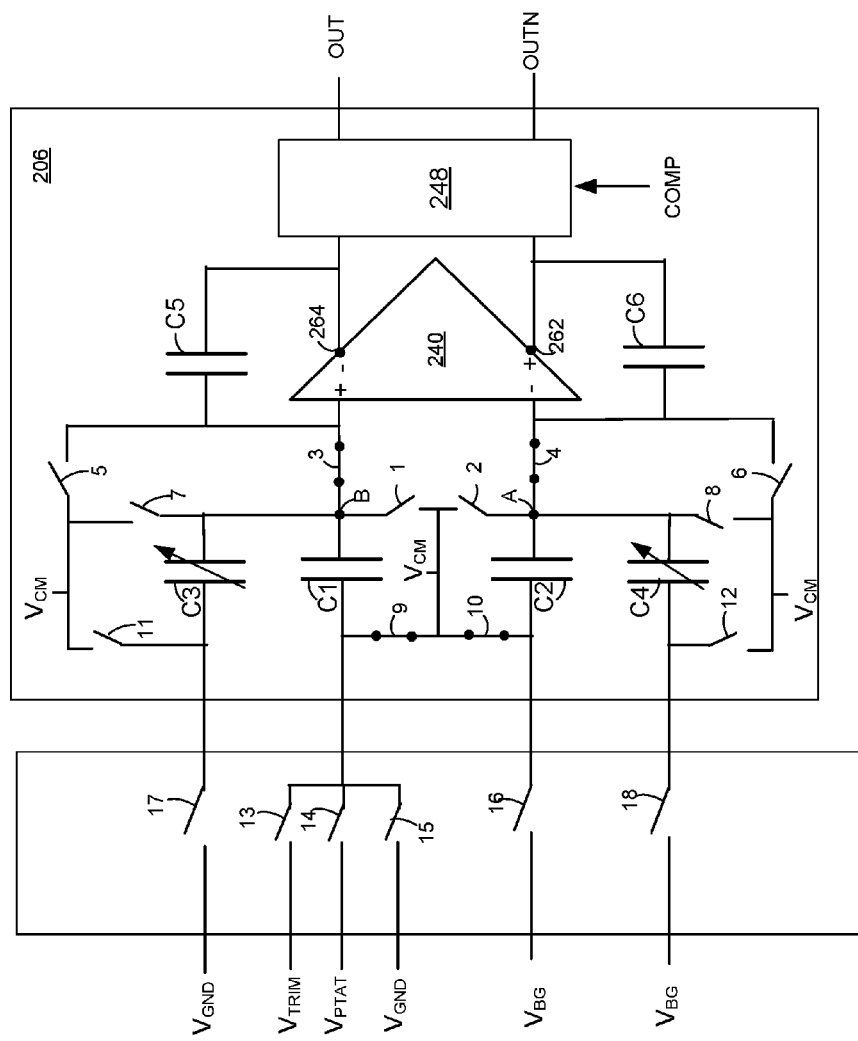
Figure 10E:
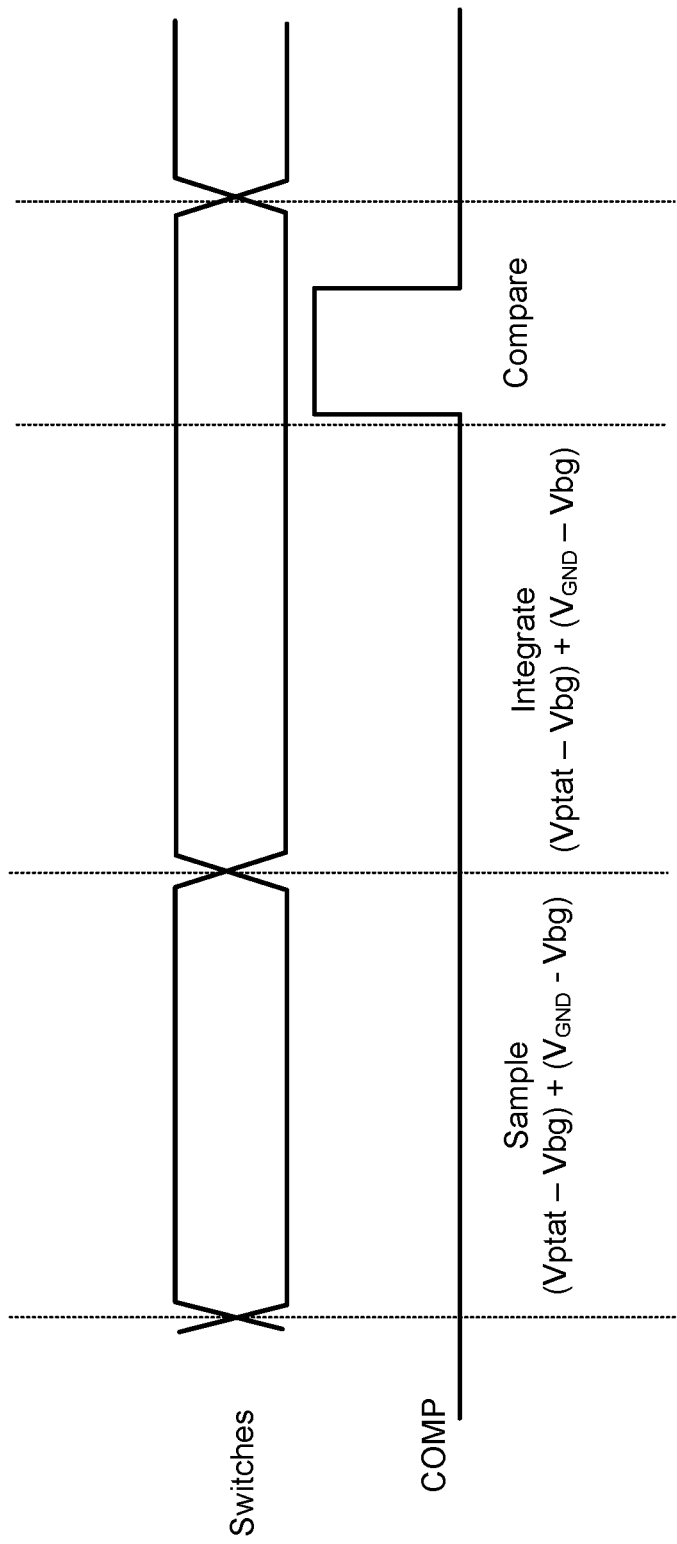
Figure 10F:
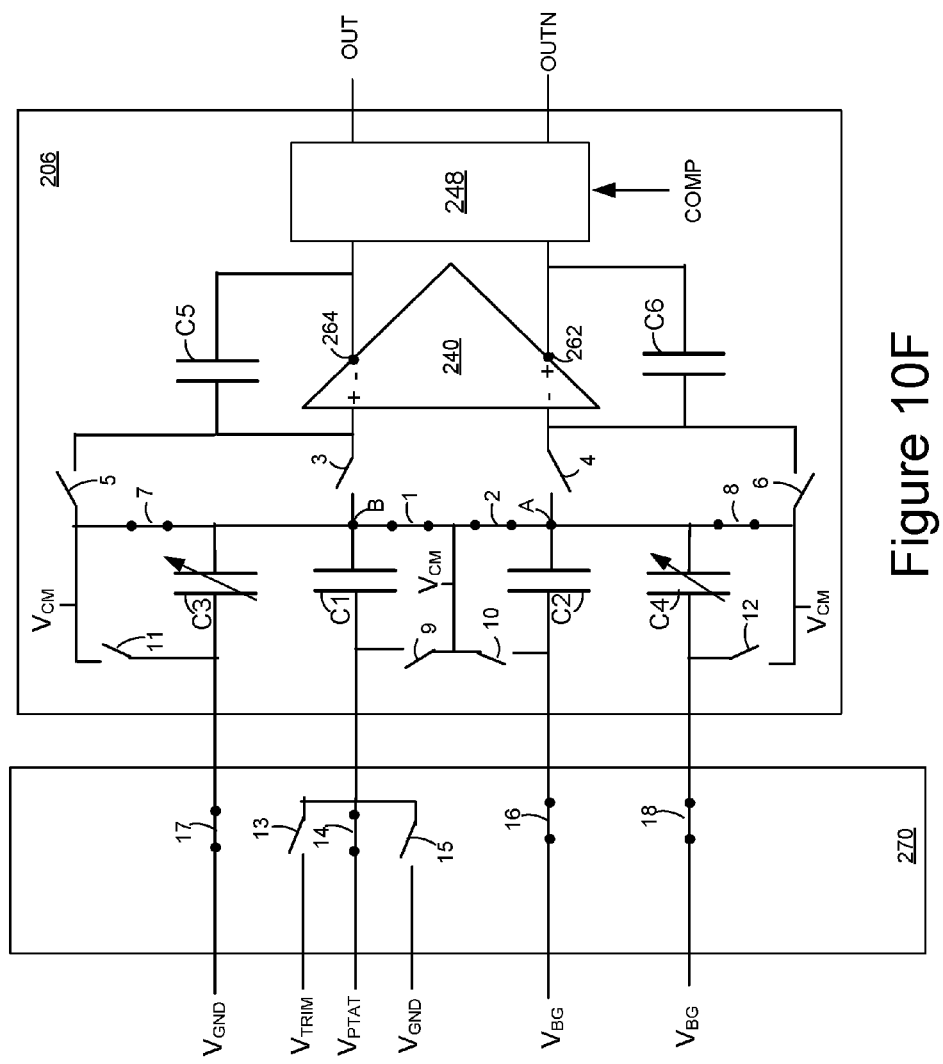
Figure 10G:
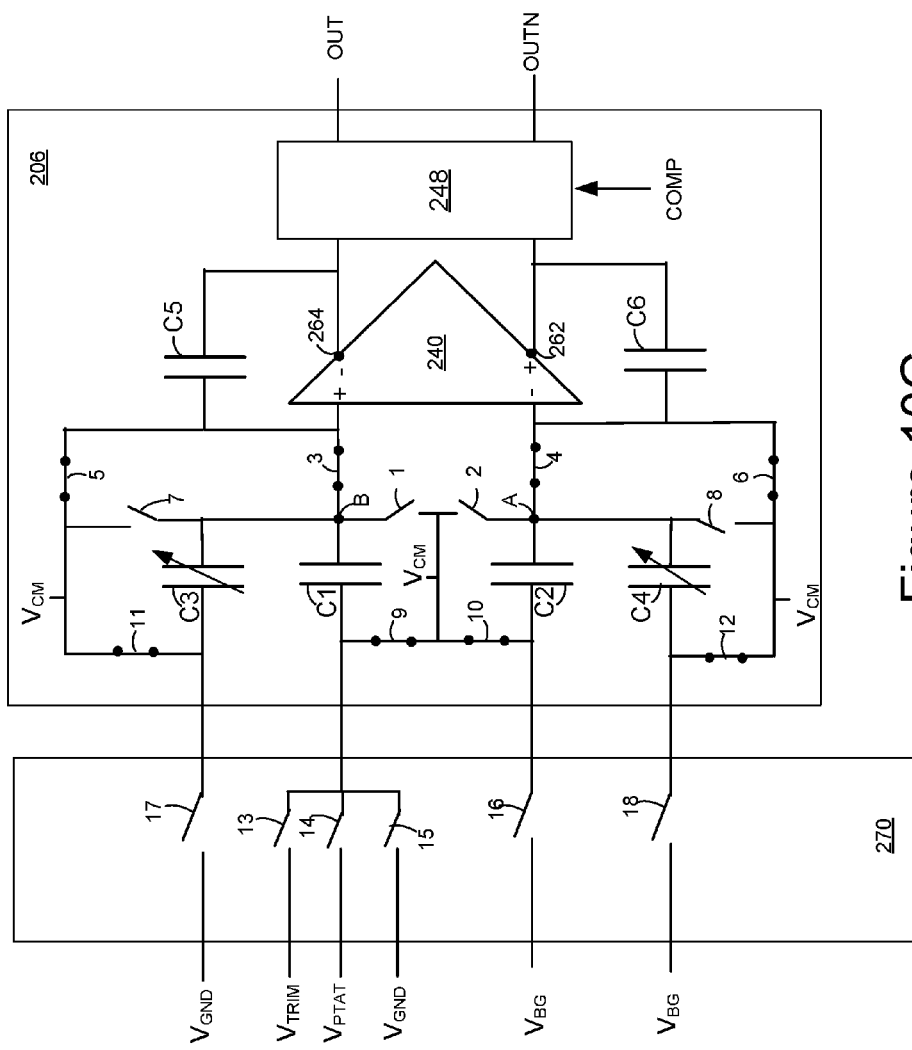

FIGS. 10B-10D refer to the case in which the most recent value of OUT=0 and OUTN=1. FIGS. 10E-10G refer to the case in which the most recent value of OUT=1 and OUTN=0. Note that there are many similarities between FIGS. 10B-10G and FIGS. 9B-9G. One difference is that instead of using $V_{TRIM}$, $V_{PTAT}$ is used.

FIG. 10B shows a timeline of these three phases for trimming $V_{PTAT}$. The switches in switches 270 and SDM ADC 206 may be established in one configuration during the sample phase and another configuration during the integration phase. Note that switches in switches 270 and SDM ADC 206 may remain in the same configuration for the compare phase as they were in the integration phase.

FIG. 10B also shows a signal "COMP", which is input to comparator 248. This signal indicates when the comparator 248 is active. Note that the comparator 248 is active only during the compare phase, in this embodiment. In one embodiment, the comparator 248 compares the voltages at nodes 262 and 264 during the compare phase. After the comparison, the comparator 248 may hold the result until the next compare phase. In one embodiment, the three phases in FIG. 10B occur during one clock cycle (e.g., one cycle of Clock in FIG. 1, CLK in FIG. 2, or CLK in FIG. 5).

FIG. 10C is a diagram of one embodiment of the use of switches in the SDM ADC 206 and switches 270 of FIG. 6 during one embodiment of a sample phase of trimming $V_{PTAT}$ for the timeline in FIG. 10B. Switch 14 is closed in order to provide $V_{PTAT}$ to capacitor C1. Switch 16 is closed in order to provide $V_{BG}$ to capacitor C2. Switch 1 is closed in order to connect $V_{CM}$ to capacitor C1. Switch 2 is closed in order to connect $V_{CM}$ to capacitor C2. Switches 3 and 4 are open. Hence, capacitor C1 is not connected to capacitor C5. Likewise, capacitor C2 is not connected to capacitor C6. Thus, during the sample phases switches 1, 2, 14 and 16 are closed. All other switches (in switches 270 and SDM ADC 206) may be open. Note that the sample phase may be used during step 1002 of FIG. 10A.

FIG. 10D is a diagram of one embodiment of the use of switches in the SDM ADC 206 and switches 270 of FIG. 6 during one embodiment of an integrate phase of trimming $V_{PTAT}$ for the timeline in FIG. 10B. Switch 14 is open. Hence, $V_{PTAT}$ is not provided to capacitor C1. Switch 16 is open. Hence, $V_{BG}$ is not provided to capacitor C2. Switch 9 is closed in order to connect $V_{CM}$ to capacitor C1. Switch 10 is closed in order to connect $V_{CM}$ to capacitor C2. Switches 3 and 4 are closed. Hence, capacitor C1 is connected to capacitor C5. Likewise, capacitor C2 is connected to capacitor C6. Thus, during the integrate phase switches 3, 4, 9, and 10 are closed. All other switches (in switches 270 and SDM ADC 206) may be open.

FIGS. 10E-10G refer to the case in which the most recent value of OUT=1 and OUTN=0 for one embodiment of trimming $V_{PTAT}$. FIG. 10E shows a timeline of with phases which include: sample phase, integrate phase, and a compare phase.

FIG. 10E also shows a signal "COMP", which is input to comparator 248. This signal indicates when the comparator 248 is active. Note that the comparator 248 is active only during the compare phase, in this embodiment. In one embodiment, the comparator 248 compares the voltages at nodes 262 and 264 during the compare phase. After the comparison, the comparator 248 may hold the result until the next compare phase. In one embodiment, the three phases in FIG. 10E occur during one clock cycle (e.g., one cycle of Clock in FIG. 1, Clk in FIG. 2, or Clk in FIG. 5).

FIG. 10F is a diagram of one embodiment of the use of switches in the SDM ADC 206 and switches 270 of FIG. 6 during one embodiment of the sample phase of trimming $V_{PTAT}$ for the timeline in FIG. 10E. Switch 17 is closed in order to provide $V_{GND}$ to capacitor C3. Switch 14 is closed in order to provide $V_{PTAT}$ to capacitor C1. Switch 16 is closed in order to provide $V_{BG}$ to capacitor C2. Switch 18 is closed in order to provide $V_{BG}$ to capacitor C4. Switch 1 is closed in order to connect $V_{CM}$ to capacitor C1. Switch 2 is closed in order to connect $V_{CM}$ to capacitor C2. Switch 7 is closed in order to connect $V_{CM}$ to capacitor C3. Switch 8 is closed in order to connect $V_{CM}$ to capacitor C4.

Switches 3 and 4 are open. Hence, capacitor C1 is not connected to capacitor C5. Likewise, capacitor C2 is not connected to capacitor C6. Moreover, capacitor C3 is not connected to capacitor C5. Likewise, capacitor C4 is not connected to capacitor C6. Thus, during the sample phase switches 1, 2, 7, 8, 14, 16, 17, and 18 are closed. All other switches (in switches 270 and SDM ADC 206) may be open. Note that the sample phase may be used during step 1002 of FIG. 10A.

FIG. 10G is a diagram of one embodiment of the use of switches in the SDM ADC 206 and switches 270 of FIG. 6 during one embodiment of an integrate phase of trimming $V_{PTAT}$ for the timeline of FIG. 10E. Switch 9 is closed in order to connect $V_{CM}$ to capacitor C1. Switch 10 is closed in order to connect $V_{CM}$ capacitor C2. Switch 11 is closed in order to connect $V_{CM}$ to capacitor C2. Switch 12 is closed in order to connect $V_{CM}$ to capacitor C4. Switches 3 and 4 are closed. Hence, capacitor C1 is connected to capacitor C5. Likewise, capacitor C2 is connected to capacitor C6. Also, switches 5 and 6 are closed. Hence, capacitor C3 is connected to capacitor C5. Likewise, capacitor C4 is connected to capacitor C6.

Thus, during the integrate phase switches 3, 4, 5, 6, 9, 10, 11 and 12 are closed. All other switches (in switches 270 and SDM ADC 206) may be open.

Figure 11:
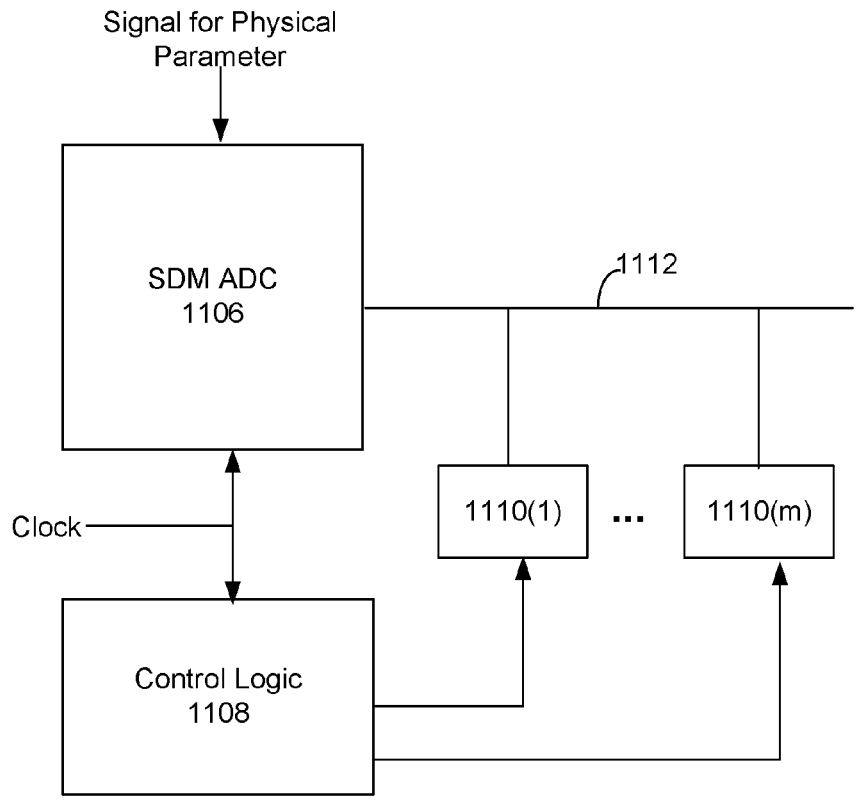
FIG. 11 is a block diagram showing one embodiment of a sensor that can provide multiple resolutions, based on the output of the same analog-to-digital converter.

Some applications require a fast measurement of a physical parameter (e.g., temperature, voltage, pressure), but can tolerate a lower resolution measurement. Other applications require a higher resolution measurement, but can tolerate a slower measurement. FIG. 11 is a block diagram showing one embodiment of a sensor that can provide multiple resolutions, based on the output of the same analog-to-digital converter. The sensor could be used to sense a wide range of physical parameters including, but not limited to, temperature, voltage, current, and pressure. The sensor comprises a sigma delta modulator (SDM) ADC 1106 that inputs a signal based on a physical parameter being sensed. In one embodiment, the SDM ADC 1106 input signal is a $V_{PTAT}$. In this case, the physical parameter may be temperature. The SDM ADC 1106 outputs a digital code onto bus 1112. In one embodiment, the bus has a width that is equal to the number of bits in the digital code. For example, each bit of the digital code may be output to one data line of the bus. The SDM ADC 1106 may update that digital code in accordance with the clock. Thus, the digital code could be updated quite frequently.

In one embodiment, the SDM ADC 1106 is a first order SDM. In one embodiment, the SDM ADC 1106 is a single bit SDM ADC. In one embodiment, the SDM ADC 1106 is both a first order single bit SDM ADC.

The sensor also has control logic 1108 and storage 1110 (1) ... 1110(m). The storage 1110 may be implemented with latches, RAM, or other storage. In one embodiment, "m" is at least two, wherein there are two or more storage units. Each storage unit may be configured to store a digital code having a different resolution. For example, storage 1110(1) may be configured to store a five bit digital code, storage unit 1110(2) (not depicted) may be configured to store an eight bit digital code, etc. In this example, storage 1110(1) may sample five data lines of bus 1112, storage 1110(2) may sample eight data lines of bus 1112, etc.

The digital code on the bus 1112 might not be very accurate when it is first output. For example, on the very first clock cycle after the SDM ADC 1106 first starts to generate the digital code, the digital code might not be very accurate. However, over time (with increasing clock cycles), the digital code may become more accurate.

In one embodiment, when the SDM ADC 1106 first starts to output the digital code only the least significant bit(s) have meaning. As the SDM ADC 1106 continues to update the digital code, the more significant bits have meaning. In one embodiment, after $2^n$ clock cycles the "n" least significant bits have meaning. For example, after 32 clock cycles ($2^5$), the five least significant bits have meaning, after 256 clock cycles ($2^8$), the eight least significant bits have meaning, after 1024 clock cycles ($2^{10}$), the ten least significant bits have meaning. A reason for this is that the SDM ADC 1106 (in combination with control logic 1108) may count ones in a stream of values output by the comparator 248 in the SDM ADC 1106. The value for the digital code may be the average number of ones over some interval.

For example, after 32 clock cycles, the digital code may be based on whether the output of the comparator 248 was a "1" or a "0" for each of the 32 clock cycles. Here, the output of the comparator 248 may refer to the "OUT" in FIG. 6 and similar Figures. Of course, the OUTN output of comparator 248 could be analyzed instead. The digital code may represent an average value of the output of the comparator 248. For example, if there were exactly 16 "ones" in 32 clock cycles, this may correspond to a digital code of "10000". If there were exactly 8 "ones" in 32 clock cycles, this may correspond to a digital code of "01000". If there were exactly 4 "ones" in 32 clock cycles, this may correspond to a digital code of "00100". If there were exactly 2 "ones" in 32 clock cycles, this may correspond to a digital code of "00010". If there was exactly 1 "ones" in 32 clock cycles, this may correspond to a digital code of "00001". In each case, only the five least significant bits have a meaning, in this example.

If there were exactly 128 "ones" in 256 clock cycles, this may correspond to a digital code of "1000_0000". If there were exactly 64 "1s" in 256 clock cycles, this may correspond to a digital code of "0100_0000". If there were exactly 32 "ones" in 256 clock cycles, this may correspond to a digital code of "0010_0000". If there were exactly 16 "ones" in 256 clock cycles, this may correspond to a digital code of "0001_0000". If there were exactly 8 "ones" in 256 clock cycles, this may correspond to a digital code of "0000_1000". If there were exactly 4 "ones" in 256 clock cycles, this may correspond to a digital code of "0000_0100". If there were exactly 2 "ones" in 256 clock cycles, this may correspond to a digital code of "0000_0010". If there was exactly 1 "ones" in 256 clock cycles, this may correspond to a digital code of "0000_0001". In each case, the eight least significant bits have a meaning, in this example.

The logic 1108 may instruct the storage 1110(1) ... 1110(n) when to sample the bus 1112. This may be based on the number of clock cycles that have passed. For example, this may be based on the number of clock cycles that have passed since the SDM ADC first generated a digital code in response to the signal for the physical parameter. In one embodiment, latching occurs after $2^n$ clock cycles, where "n" is the number of bits for the code stored by the storage.

For example, if storage 1110(1) stores a 5 bit digital code, the logic 1108 can instruct storage 1110(1) to store data from bus 1112 after 32 clock cycles. This may allow the respective storage units to store values based on the output of comparator 248 over 2^n consecutive clock cycles.

Figure 12:
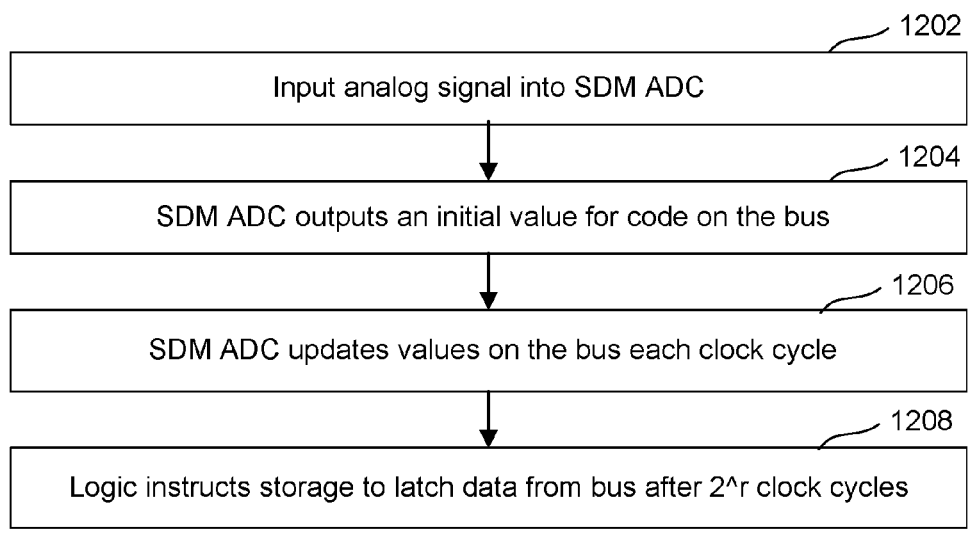
FIG. 12 is one embodiment of a process of operating a sensor at multiple resolutions.

FIG. 12 is one embodiment of a process 1200 of operating a sensor at multiple resolutions. This process 1200 could be used to operate the sensor of FIG. 11. In step 1202, an analog signal is input to the SDM ADC 1106. This might be a voltage, current, or some other signal. In one embodiment, the signal is a voltage (or alternatively current) that represents some other physical parameter. For example, a voltage (e.g., $V_{PTAT}$) can represent temperature.

In step 1204, the SDM ADC 1106 puts an initial value for a digital code on the bus 1112. In one embodiment, this initial value is based on a single value of the output of comparator 248. Thus, this value could only be "1" or "0", in one embodiment. In one embodiment, only one bit of the initial value for the digital code has a meaning. For example, only the least significant bit has a meaning for the very first digital code, in one embodiment.

In step 1206, the SDM ADC 1106 updates the digital code on the bus 1112 each clock cycle. As the digital code is updated, more bits have a meaning, in one embodiment. As discussed above, the digital code can be based on further output of the comparator 248.

In step 1208, the control logic 1108 instructs the storage to latch data from the bus 1112 after 2^r clock cycles, where "r" is the number of bits for the code stored by the storage. In one embodiment, by "2^r clock cycles after the SDM ADC first puts the digital code onto the plurality of data lines" the clock cycle in which the digital code is first output is included in the count. For example, if r=5, this refers to the 32nd clock cycle. Note that for different storage, the value of "r" may be different. For example, if r=8, this refers to storage after the 256th clock cycle. Note that over time, the values on the bus 1112 may become more accurate. Stated another way, over time more bits in the digital code have a meaning, in one embodiment.

Note that another way of stating the operation in step 1208 is in terms of clock cycles after the digital code is first output to the bus (which does not count the initial clock cycle). In this case, the control logic 1108 may instruct a first storage unit to sample "n" bits of the digital code that are on the data bus "2^n−1" clock cycles after the initial clock cycle. The control logic 1108 may instruct a first storage unit to sample "m" bits of the digital code that are on the data bus "2^m−1" clock cycles after the initial clock cycle, wherein "m" is greater than "n".

Figure 13A:
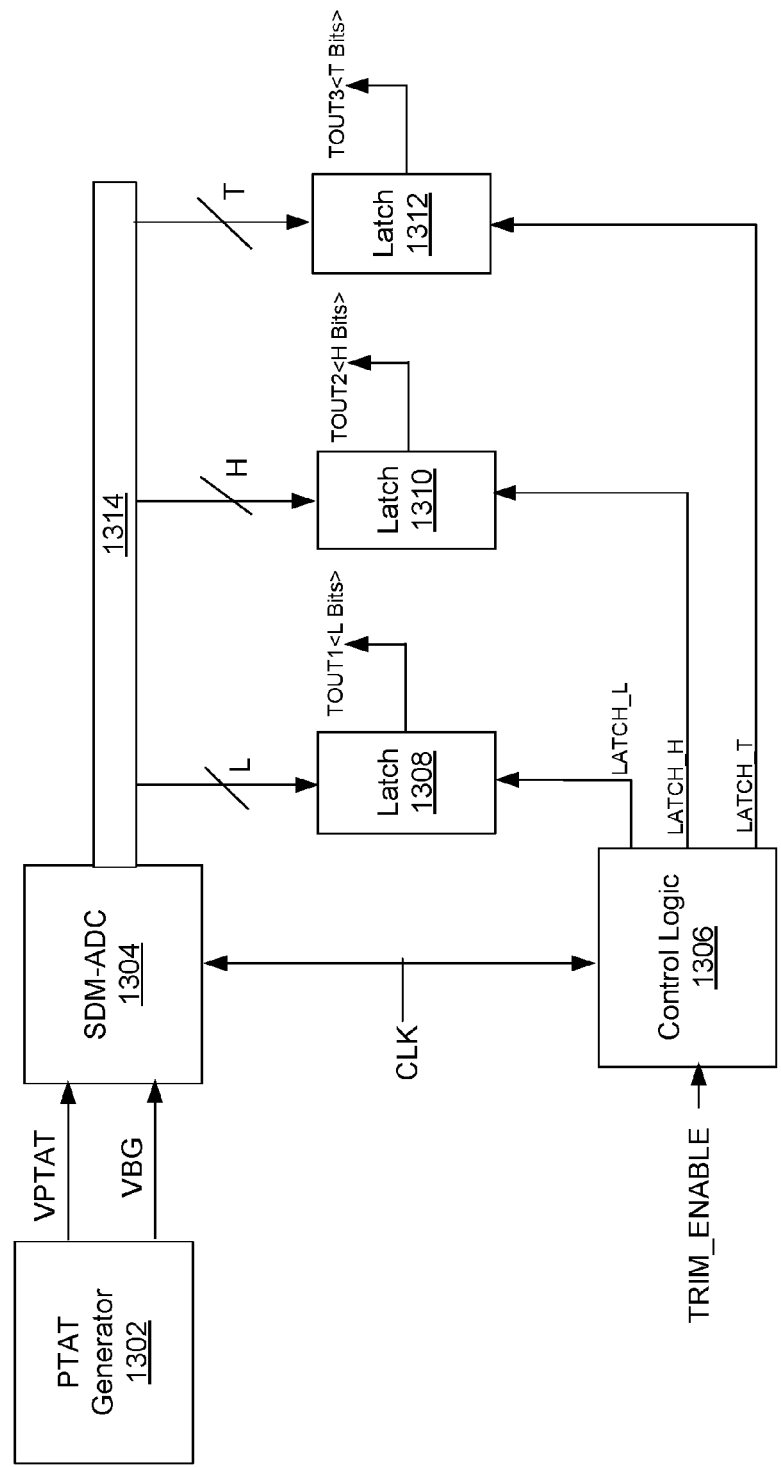
FIG. 13A is a diagram of one embodiment of a sensor that can provide multiple resolutions, based on the output of the same analog-to-digital converter.

FIG. 13A is a diagram of one embodiment of a temperature sensor that can provide multiple resolutions, based on the output of the same analog-to-digital converter. The temperature sensor is one embodiment of the sensor of FIG. 11. In FIG. 13A, the temperature sensor has a PTAT generator 1302, SDM-ADC 1304, control logic 1306, three latches 1308, 1310, 1312, and bus 1314.

The PTAT generator 1302 provides a $V_{PTAT}$ ($V_{PTAT}$) and a $V_{BG}$ ($V_{BG}$) to the SDM-ADC 1304 in this embodiment. In one embodiment, PTAT generator 1302 is implemented with the bandgap circuit 204a of FIG. 2. In one embodiment, PTAT generator 1302 is implemented with the PTAT circuit 204b of FIG. 3. However, other PTAT generators could be used. Note that in one embodiment rather than providing both a $V_{PTAT}$ and a $V_{BG}$, only the $V_{PTAT}$ is provide to the SDM-ADC 1304. In this example, rather than using $V_{BG}$, some other reference voltage might be used. The SDM-ADC 1304 outputs a temperature code to the bus 1314.

Latch 1308 stores "L" bits, latch 1310 stores "H" bits, and latch 1312 stores "T" bits. In one embodiment, L<H<T. The counter and logic 1306 instructs latch 1308 to storage the data that is on the bus 1314 after 2^L clock cycles, instructs latch 1310 to storage the data that is on the bus 1314 after 2^H clock cycles, and instructs latch 1312 to storage the data that is on the bus 1314 after 2^T clock cycles, in one embodiment. In one embodiment, by "after some number of clock cycles" it is meant with respect to after SDM ADC placed an initial value for the code on the bus 1314. For example, latch 1308 may sample at the 32nd clock cycle, latch 1310 may sample at the 256th clock cycle, and latch 1312 may sample at the 1028th clock cycle. Latch 1308 may be read to provide an "L" bit temperature code TOUT1<L bits>, latch 1310 may be read to provide an "H" bit temperature code TOUT2<H bits>, latch 1312 may be read to provide a "T" bit temperature code TOUT3<T bits>.

In one embodiment, latch 1308 is used to provide the temperature code the fastest of the three latches. However, the resolution is the lowest of the three latches. In one embodiment, latch 1310 is used to provide a temperature code with a higher resolution than latch 1308, but at the expense of taking longer than latch 1308. In one embodiment, latch 1312 is used during trimming of the sensor. This may include trimming the PTAT generator 1302 and/or the SDM ADC 1304. Note that the logic inputs a TRIM ENABLE signal to enable a trim operation.

Figure 13B:
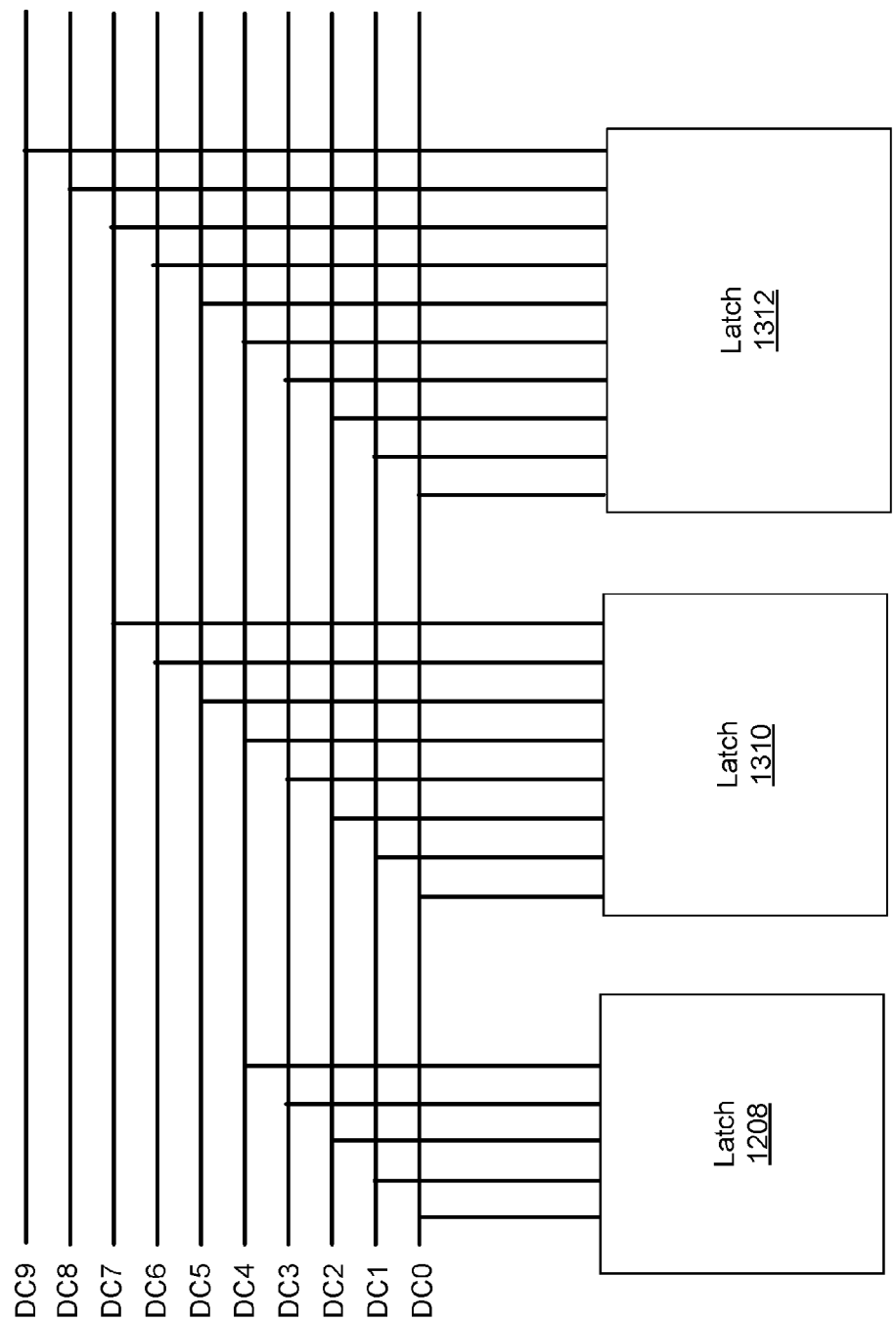
FIG. 13B provides further details for connections between the bus of the sensor of FIG. 13A and the latches.

FIG. 13B provides further details for connections between the bus 1314 of the sensor of FIG. 13A and the latches 1308, 1310, 1312. The bus has 10 data lines in this example. The 10 data lines are provided with DC0-DC9, which represent 10 bits in a digital code. In this example, DC0 is the least significant bit (LSB). The data lines that receive the five LSB (DC0-DC4) are input to latch 1308. The data lines that receive the eight LSB (DC0-DC7) are input to latch 1310. All data lines (DC0-DC9) are input to latch 1312.

The circuits of FIGS. 11 and 13A allow one piece of hardware to serve multiple purposes without significant area penalty. Thus, chip real estate may be saved. Both fast reading and accurate output are obtained. Accurate trimming is enabled without increasing the circuit cost significantly.

Figure 14:
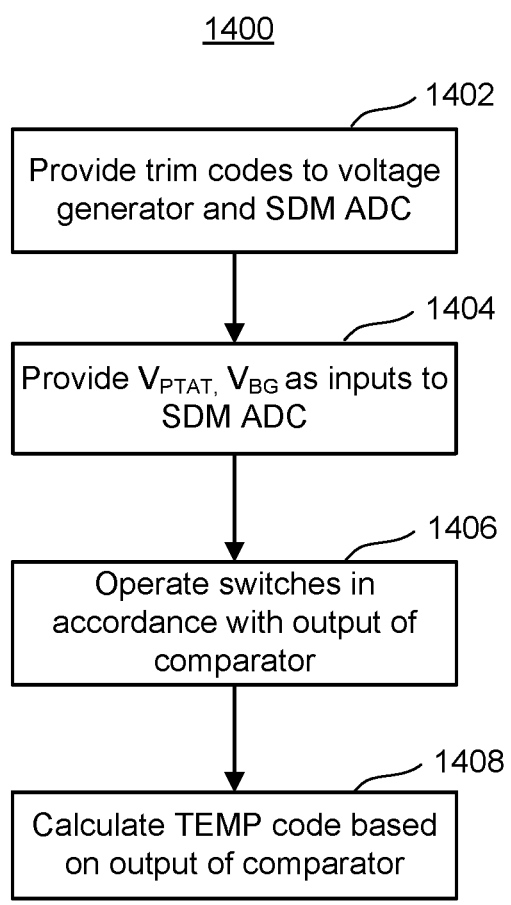
FIG. 14 is a flowchart of one embodiment of a process of determining a temperature code.

FIG. 14 is a flowchart of one embodiment of a process 1400 of determining a temperature code. The process 1400 may be practiced by various sensors and sub-circuits described herein, such as the sensor in FIGS. 1, 2, 3, 6, 10C, 10D, 10F, and 10G. In step 1402, trim codes are provided to the reference generator 204 and the SDM ADC 206. This trim codes may be determined by one or more of process 700, 800, 900 and/or 1000. In one embodiment, a trim code is provided to bandgap circuit 204a to trim resistor 222 in bandgap circuit 204a (see FIG. 2). In one embodiment, a trim code is provided to bandgap circuit 204b to trim resistor 222 in bandgap circuit 204b (see FIG. 3). More generally, a trim code may be provided to reference generator 204 to trim a band gap voltage. In one embodiment, a trim code is provided to trim resistor 222 in bandgap circuit 204a (FIG. 2) or 204b (FIG. 3). More generally, a trim code may be provided to reference generator 204 to trim a PTAT voltage. In one embodiment, a trim code is provided to SDM ADC 206 (e.g., FIG. 2 or 6) to trim capacitors C3 and C4.

In step 1404, $V_{PTAT}$ and $V_{BG}$ are provided from a reference generator 204 to SDM ADC 206. Note that when switches 14 and 1 are closed (e.g., FIG. 10C) $V_{PTAT}$ is provided to one side of Capacitor C1, with $V_{CM}$ provided to the other side of Capacitor C1. Also, when this is followed by closing switches 3 and 9 (e.g., FIG. 10D) $V_{PTAT}$ may be passed to the non-inverting input of amplifier 240. Note that when switches 16 and 2 are closed (e.g., FIG. 10C) $V_{BG}$ is provided to one side of Capacitor C2, with $V_{CM}$ provided to the other side of Capacitor C2. Also, when this is followed by closing switches 4 and 10 (e.g., FIG. 10D) $V_{BG}$ may be passed to the inverting input of amplifier 240. This may be referred to as providing $V_{PTAT}-V_{BG}$ to an input of the SDM ADC 206. Here, the input may be the combination of the inverting input and the non-inverting input of the SDM ADC 206. For example, $V_{PTAT}$ may be provided to the non-inverting input of differential amplifier 240 and $V_{BG}$ may be provided to the inverting input of differential amplifier 240.

In step 1406, SDM ADC 206 is operated based on the output of the comparator 248. In one embodiment, switches 270 and switches in SDM ADC 206 are operated based on an output of comparator 248. In one embodiment, this operation is similar to operation described with respect to trimming $V_{PTAT}$ that was described in connection with FIGS. 10B-10G. Thus, in one embodiment, step 1406 includes operating switches 270 and switches in SDM ADC 206 in accordance with FIGS. 10B-10G and the associated description. Recall that the decision of what voltages are input (e.g., either FIG. 10C or 10F) may be based on the most recent output of the comparator 248.

In step 1408, a digital TEMP code is calculated based on an output of the comparator 248. In one embodiment, this is based on a count of the number of ones output by comparator 248 in a COMPOUT signal. The digital code may be based on the average number of ones over some number of clock cycles. This step 1408 may be performed by control logic 208.

Figure 15:
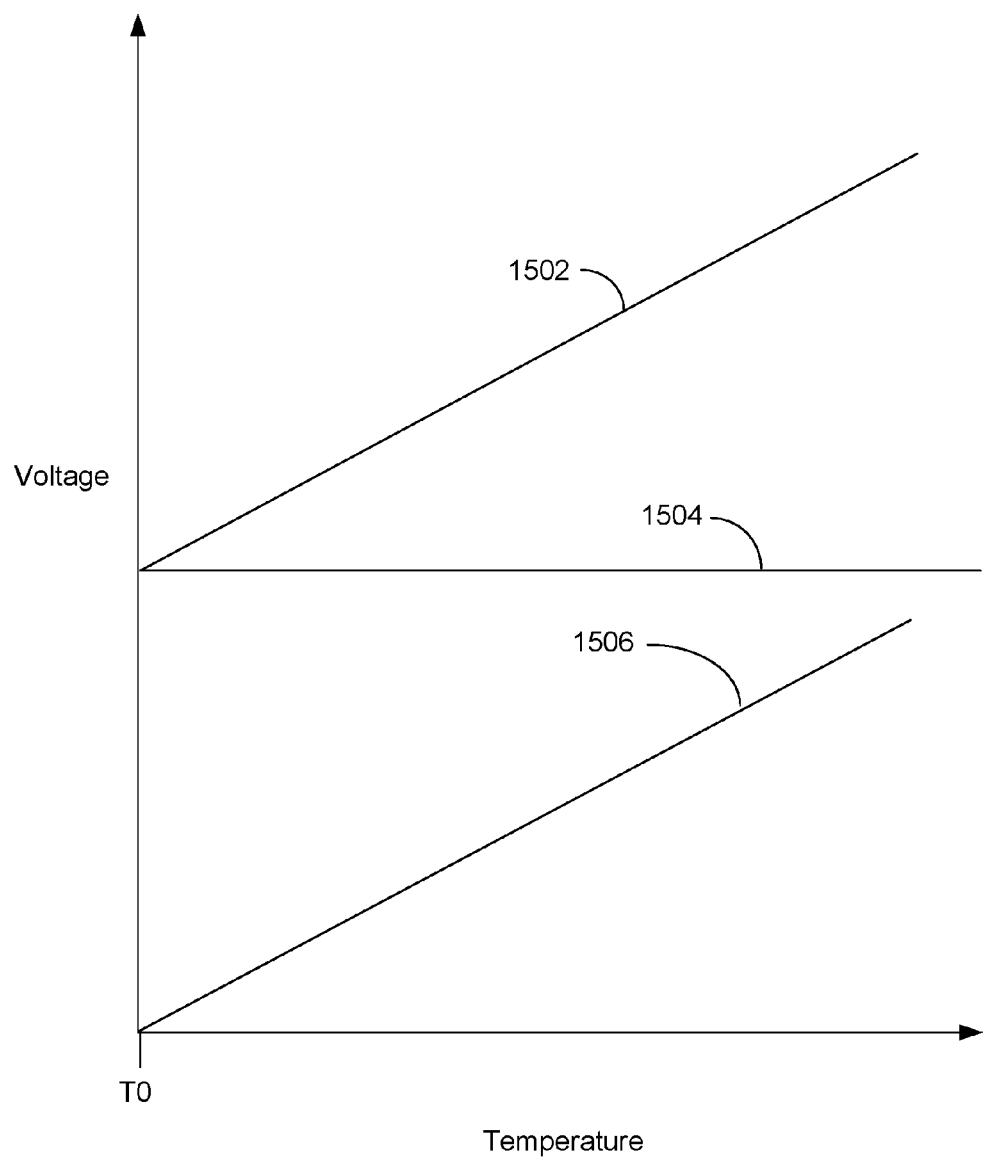
FIG. 15 is a graph of voltage versus temperature for one embodiment of $V_{PTAT}$ and $V_{BG}$.

FIG. 15 is a graph of voltage versus temperature for one embodiment of $V_{PTAT}$ and $V_{BG}$. $V_{PTAT}$ 1502 shows a temperature dependence. $V_{BG}$ 1504 is independent of temperature, in this embodiment. Line 1506 represents $V_{PTAT}-V_{BG}$. Note that the point at which $V_{PTAT}=V_{BG}$ may be selected to occur at a desired temperature, which is referred to as T0. In one embodiment, T0 corresponds to the lowest temperature code.

Embodiments may be practiced in various devices including, but not limited to, memory devices, systems on a chip (SoCs), computing devices, desktop computers laptop computers, notepad computers, cellular telephones, personal digital assistants, personal navigation devices, microwave ovens, refrigerators, control circuits, and other devices for which a measurement of some physical parameter (including, but not limited to, temperature) is desired. For the sake of illustration, the following is one example implementation of a memory device in which embodiments may be practiced.

One example implementation of a memory device includes a plurality of NAND strings (or other arrangements) that form a monolithic three dimensional memory structure, bit lines, word lines, and one or more control circuits. Multiple NAND strings of the plurality of NAND strings have different select gates connected to different select lines. The multiple NAND strings are connected to a common bit line. The multiple NAND strings are connected to a common word line via their respective different select gates. The one or more control circuits concurrently program multiple memory cells on the multiple NAND strings that are connected to the common bit line and the common word line.

Figure 16:
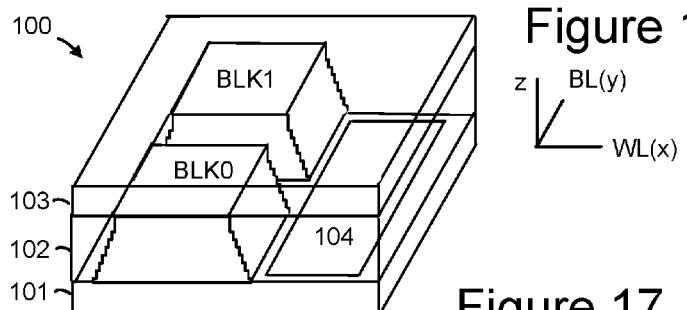
FIG. 16 is a perspective view of a 3D stacked non-volatile memory device.

FIG. 16 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 17:
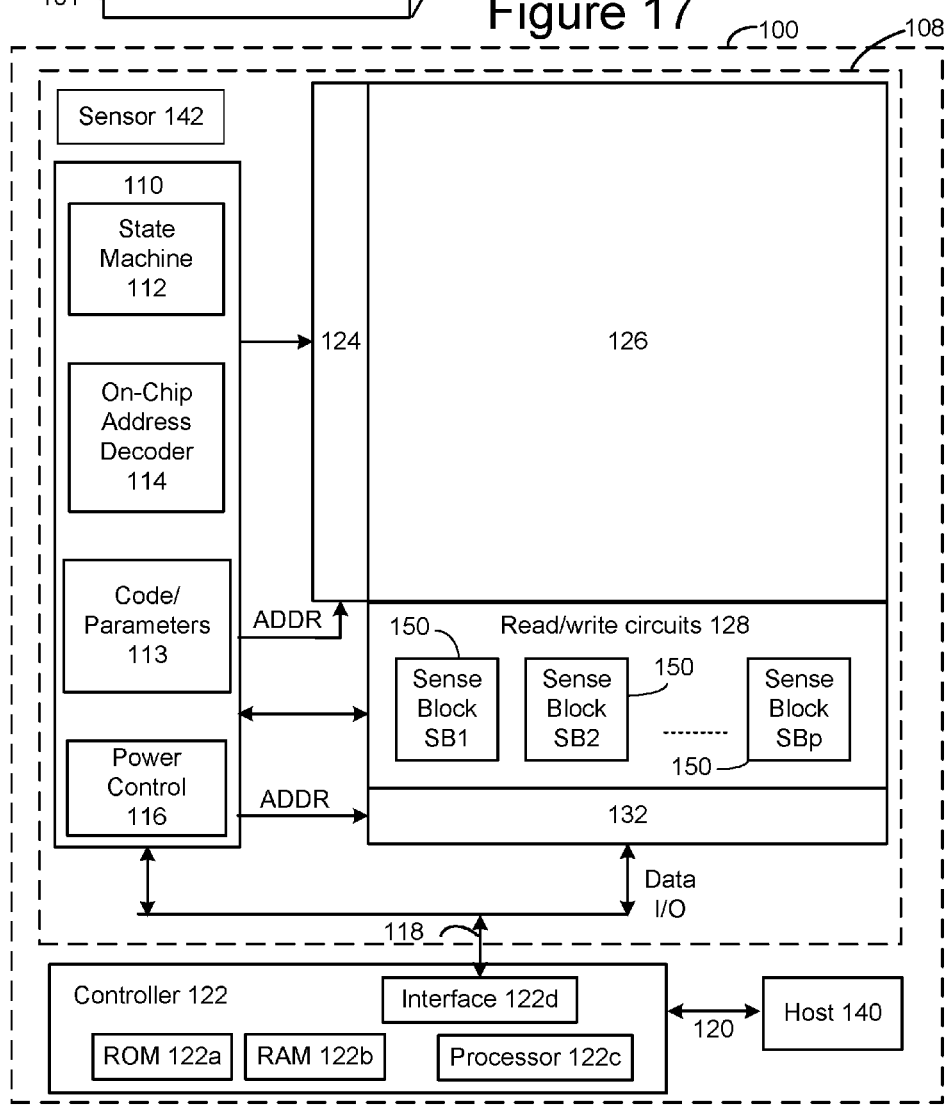
FIG. 17 is a functional block diagram of a memory device such as the 3D stacked non-volatile memory device of FIG. 16.

FIG. 17 is a functional block diagram of an example memory device such as the 3D stacked non-volatile memory device 100 of FIG. 16. The components depicted in FIG. 2 are electrical circuits. The memory device 100 includes a sensor 142. In one embodiment, sensor 142 includes a temperature sensor. The temperature sensor 142 is able to sense a present environmental temperature and provide a temperature code to other electrical circuits in the memory device 100, in one embodiment. The other electrical circuits may use the temperature code to, for example, adjust operating voltages. These operating voltages could include voltages that are used to program, erase, and/or read memory cells in the memory array 126.

In one embodiment, sensor 142 includes a voltage sensor. The voltage sensor might be used to sense a voltage that is supplied (e.g., supply voltage) to various electrical circuits. The memory device 100 may adjust operating parameters based on the level of the supply voltage. The sensor 142 may be able to sense other physical parameters (e.g., current). Note that to sense different physical parameters the sensor 142 may be considered to be multiple separate sensors.

In one embodiment, a portion of the logic of the sensor 142 is implemented by control circuitry 110. For example, state machine 112 can be used in sensor control logic (see control logic 208 in FIGS. 1, 2; control logic 1108 in FIG. 11, control logic 1306 in FIG. 13A). In one embodiment, a portion of the logic of the sensor 142 is implemented by controller 122. For example, controller 122 can be used in sensor control logic (see control logic 208 in FIGS. 1, 2; control logic 1108 in FIG. 11, control logic 1306 in FIG. 13A).

Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the controller can be separated from the memory die 108. In some embodiments the controller will be on a different die than the memory die. In some embodiments, one Controller 122 will communicate with multiple memory die 108. In other embodiments, each memory die 108 has its own controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electrical circuits).

The on-chip address decoder 114 provides an address interface between addresses used by host 140 or memory Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of sensor 142, control circuitry 110, state machine 112, decoders 114/124/132, code and parameter storage 113, power control module 116, sense blocks 150, read/write circuits 128, and Controller 122 can be considered one or more control circuits (or a managing circuit) that performs the functions described herein.

The (on-chip or off-chip) Controller 122 may comprise a processor 122c, ROM 122a, RAM 122b and a Memory Interface 122d, all of which are interconnected. Processor 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Although the example memory system discussed above is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

One embodiment disclosed herein includes an apparatus comprising a sigma delta modulator (SDM) analog-to-digital convertor (ADC) having an input and an output that responds to the input. The apparatus further comprises logic configured to provide a proportional to absolute temperature voltage ($V_{PTAT}$) minus a temperature independent reference voltage ($V_{REF}$) to the input of the SDM ADC. The logic is configured to generate a digital temperature code based on the output of the SDM ADC.

One embodiment disclosed herein includes a method comprising: generating a band gap voltage ($V_{BG}$); generating a proportional to absolute temperature voltage ($V_{PTAT}$); providing a voltage input signal as an input to a sigma delta modulator (SDM) analog-to-digital convertor (ADC), the voltage input signal comprising the proportional to absolute temperature voltage minus the band gap voltage; and generating a digital temperature code based on an output of the SDM ADC.

One embodiment disclosed herein includes an apparatus comprising: a reference generator configured to generate a bandgap voltage and a proportional to absolute temperature voltage; a first order, single-bit sigma delta modulator (SDM) analog-to-digital convertor (ADC); and control logic configured to provide the proportional to absolute temperature voltage minus the bandgap voltage as an input of the SDM ADC. The control logic is configured to generate a digital temperature code based on an output of the SDM ADC.

One embodiment disclosed herein includes apparatus comprising reference voltage generation means for generating a band gap voltage ($V_{BG}$). The reference voltage generation means further for generating a proportional to absolute temperature voltage ($V_{PTAT}$). The apparatus further comprises control means for providing the proportional to absolute temperature voltage minus the band gap voltage as an input of a sigma delta modulator (SDM) analog-to-digital convertor (ADC), wherein the control means is further for generating a digital temperature code based on an output of the SDM ADC.

A reference voltage generation means for generating a band gap voltage ($V_{BG}$), in various embodiments, may include reference generator 204, band gap circuit 204a, bandgap circuit 204b, diodes (e.g., diodes D1, D2 and D3), resistors (e.g., resistors 220, 222, 224), transistors (e.g., transistors 210, 212, 213, 214, 228, 230, 217-276), switches (e.g., DEM switches 218, switches 226, 277, 278), operational amplifiers (e.g., operational amplifier 279) and/or other hardware. Other embodiments may include similar or equivalent means for generating a band gap voltage.

A control means for providing the proportional to absolute temperature voltage minus the band gap voltage as an input of a sigma delta modulator (SDM) analog-to-digital convertor (ADC), in various embodiments, may include control logic 208, switches 251-260, switches 1-18, capacitors C1-C4, switches 270, control circuitry 110, state machine 112, controller 122, processor 122c, transistors, and/or other hardware. Other embodiments may include similar or equivalent means for providing the proportional to absolute temperature voltage minus the band gap voltage as an input of a sigma delta modulator (SDM) analog-to-digital convertor (ADC).

A control means that is further for generating a digital temperature code based on an output of the SDM ADC, in various embodiments, may include control logic 208, switches 270, switches 251-260, switches 1-18, capacitors C1-C6, switches 270, compare logic 248, control circuitry 110, state machine 112, controller 122, processor 122c, transistors, and/or other hardware. Other embodiments may include similar or equivalent means for generating a digital temperature code based on an output of the SDM ADC.

One embodiment disclosed herein includes an apparatus, comprising: a sigma delta modulator (SDM) analog-to-digital convertor (ADC) configured to receive an analog signal and to output each bit of a digital code for the analog signal to a different data line of a plurality of data lines. The SDM ADC is configured to update the digital code on the plurality of data lines in accordance with a clock signal. The apparatus further comprises a plurality of storage units. Each storage unit is coupled to data lines of the plurality of data lines that provide "r" least significant bits of the digital code, wherein "r" is a different number for at least two of the plurality of storage units. The apparatus further comprises control logic configured to instruct respective storage units of the plurality of storage units to sample the "r" data lines to which the respective storage unit is coupled $2^r$ clock cycles after the SDM ADC first puts the digital code onto the plurality of data lines.

One embodiment disclosed herein includes a method comprising: inputting an analog signal into a sigma delta modulator (SDM) analog-to-digital convertor (ADC); outputting an initial value for a digital code for the analog signal, by the SDM ADC, onto a data bus during a first clock cycle; outputting an updated digital code for the analog signal, by the SDM ADC, onto the data bus for each clock cycle after the first clock cycle; instructing a first storage unit to sample "n" bits of the digital code that are on the data bus "$2^n-1$" clock cycles after the first clock cycle; and instructing a second storage unit to sample "m" bits of the digital code that are on the data bus "$2^m-1$" clock cycles after the first clock cycle, wherein "m" is greater than "n".

One embodiment disclosed herein includes an apparatus comprising: a reference voltage generator configured to generate a bandgap voltage and a proportional to temperature voltage; a single-bit, first-order sigma delta modulator (SDM) analog-to-digital convertor (ADC) coupled to the reference voltage generator; and a bus having data lines coupled to the SDM ADC. The SDM ADC is configured to output a digital code having a least significant bit and a most significant bit onto the data lines. The SDM ADC is configured to update the digital code each cycle of a clock signal. The apparatus further comprises a first storage unit coupled to "n" of the data lines that provide the "n" least significant bits of the digital code; a second storage unit coupled to "m" of the data lines that provide the "m" least significant bits of the digital code, wherein "m" is greater than "n"; and control logic configured to instruct the first storage unit to sample the "n" data lines that provide the "n" least significant bits of the digital code $2^n$ clock cycles after the SDM ADC first puts the digital code onto the bus and to instruct the second storage unit to sample the "m" data lines that provide the "m" least significant bits of the digital code $2^m$ clock cycles after the SDM ADC first puts the digital code onto the bus.

One embodiment disclosed herein includes an apparatus comprising: reference voltage generator means for generating a bandgap voltage and a proportional to temperature voltage; analog-to-digital conversion means for converting an analog signal to a digital code and outputting the digital code, wherein the analog-to-digital conversion means is for performing sigma delta modulation on the analog signal, wherein the analog-to-digital conversion means is for updating the digital code in accordance with a clock signal; a plurality of storage means for storing the "r" least significant bits of the digital code, wherein at least two of the plurality of storage means have a different value for "r"; and control means for instructing the respective storage means to sample the digital code $2^r$ clock cycles after an initial digital code is output by the analog-to-digital conversion means.

A reference voltage generator means for generating a bandgap voltage and a proportional to temperature voltage, in various embodiments, may include reference generator 204, band gap circuit 204a, bandgap circuit 204b, diodes (e.g., diodes D1, D2 and D3), resistors (e.g., resistors 220, 222, 224), transistors (e.g., transistors 210, 212, 213, 214, 228, 230, 217-276), switches (e.g., DEM switches 218, switches 226, 277, 278), operational amplifiers (e.g., operational amplifier 279) and/or other hardware. Other embodiments may include similar or equivalent means for generating a bandgap voltage and a proportional to temperature voltage.

An analog-to-digital conversion means for converting an analog signal to a digital code and outputting the digital code, in various embodiments, may include SDM ADC 206, amplifier 240, compare logic 248, control logic 208, capacitors C1-C6, switches 251-260, switches 1-18, and/or other hardware. Other embodiments may include similar or equivalent means for converting an analog signal to a digital code and outputting the digital code.

An analog-to-digital conversion means is for performing sigma delta modulation on the analog signal, in various embodiments, may include SDM ADC 206, amplifier 240, compare logic 248, control logic 208, capacitors C1-C6, switches 251-260, switches 1-18, and/or other hardware. Other embodiments may include similar or equivalent means for performing sigma delta modulation on the analog signal.

An analog-to-digital conversion means for updating the digital code in accordance with a clock signal, in various embodiments, may include SDM ADC 206, amplifier 240, compare logic 248, control logic 208, capacitors C1-C6, switches 251-260, switches 1-18, and/or other hardware. Other embodiments may include similar or equivalent means for updating the digital code in accordance with a clock signal.

A plurality of storage means for storing the "r" least significant bits of the digital code, in various embodiments, may include, latches 1110(1)-1110(n); latches 1308, 1310, 1312; and/or other hardware. Other embodiments may include similar or equivalent means for storing the "r" least significant bits of the digital code.

Control means for instructing the respective storage means to sample the digital code $2^r$ clock cycles after an initial digital code is output by the analog-to-digital conversion means, in various embodiments, may include, control logic 1108, control circuitry 110, state machine 112, controller 122, processor 122c, digital logic, an ASIC (Application Specific Integrated Circuit), RAM, and/or ROM, and/or other hardware. Other embodiments may include similar or equivalent means for storing the "r" least significant bits of the digital code.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a sigma delta modulator (SDM) analog-to-digital convertor (ADC) configured to receive an analog signal and to output each bit of a digital code for the analog signal to a different data line of a plurality of data lines, the SDM ADC configured to update the digital code on the plurality of data lines in accordance with a clock signal;
a plurality of storage units, each storage unit coupled to data lines of the plurality of data lines that provide "r" least significant bits of the digital code, wherein "r" is a different number for at least two of the plurality of storage units; and
control logic configured to instruct respective storage units of the plurality of storage units to sample "r" of the data lines to which the respective storage unit is coupled $2^r$ clock cycles after the SDM ADC first puts an initial value for the digital code onto the plurality of data lines.

2. The apparatus of claim 1, wherein the SDM ADC further comprises a comparator configured to output a comparison signal each cycle of the clock signal based on the analog signal, the digital code that each respective storage unit stores being based on values for the comparison signal for $2^r$ clock cycles, wherein "r" is a resolution of the digital code for the respective storage unit.

3. The apparatus of claim 1, wherein the SDM ADC further comprises a comparator configured to output a comparison signal each cycle of the clock signal based on the analog signal, the control logic comprising a counter configured to output the digital code on the plurality of data lines based on values for the comparison signal for a group of clock cycles.

4. The apparatus of claim 1, wherein the SDM ADC further comprises:
a fully differential amplifier having a first output and a second output, the SDM ADC configured to perform a first integration each clock cycle based on the analog signal and a first value at the first output and to perform a second integration each clock cycle based on a reference signal and a second value at the second output;
a comparator configured output a comparison of the first value with the second value each clock cycle; and
control logic configured to update the digital code each clock cycle based on the comparator output for a present clock cycle and previous clock cycles.

5. The apparatus of claim 1, wherein the sigma delta modulator is a first order sigma delta modulator.

6. The apparatus of claim 5, wherein the sigma delta modulator is a single bit sigma delta modulator.

7. The apparatus of claim 1, wherein the sigma delta modulator is a single bit sigma delta modulator.

8. The apparatus of claim 1, further comprising:
a reference voltage generator configured to generate a proportional to temperature voltage, wherein the analog signal is the proportional to temperature voltage.

9. The apparatus of claim 1, further comprising:
a three-dimensional memory array of non-volatile storage elements, the control logic configured to perform on operation on the non-volatile storage elements based on the digital code from one or more of the plurality of storage units.

10. A method comprising:
inputting an analog signal into a sigma delta modulator (SDM) analog-to-digital convertor (ADC);
outputting an initial value for a digital code for the analog signal, by the SDM ADC, onto a data bus during a first clock cycle;
outputting an updated digital code for the analog signal, by the SDM ADC, onto the data bus for each clock cycle after the first clock cycle;
instructing, by control logic, a first storage unit to sample "n" bits of the digital code that are on the data bus "$2^n-1$" clock cycles after the first clock cycle; and
instructing, by the control logic, a second storage unit to sample "m" bits of the digital code that are on the data bus "$2^m-1$" clock cycles after the first clock cycle, wherein "m" is greater than "n".

11. The method of claim 10, wherein outputting the updated digital code, by the SDM ADC, onto the data bus for each clock cycle after the first clock cycle comprises:
performing, by the SDM ADC, a comparison each clock cycle based on the analog signal; and
determining, by the SDM ADC, the updated digital code based on results of the comparison for the first clock cycle and results of the comparison for each following clock cycle.

12. The method of claim 11, wherein performing the comparison each clock cycle based on the analog signal comprises:
sampling the analog signal by the SDM ADC; and
integrating, by the SDM ADC, based on the sampled analog signal and a previous output of the SDM ADC.

13. The method of claim 10, wherein outputting the updated digital code, by the SDM ADC, onto the data bus for each clock cycle after the first clock cycle comprises:
counting a number of ones output by the SDM ADC from the first clock cycle to a present clock cycle.

14. The method of claim 10, wherein the analog signal comprises a proportional to absolute temperature signal, wherein the digital code is a temperature code.

15. An apparatus, comprising:
a reference voltage generator configured to generate a bandgap voltage and a proportional to temperature voltage;
a single-bit, first-order sigma delta modulator (SDM) analog-to-digital convertor (ADC) coupled to the reference voltage generator;
a bus having data lines coupled to the SDM ADC, wherein the SDM ADC is configured to output a digital code having a least significant bit and a most significant bit onto the data lines, wherein the digital code is based on the bandgap voltage and the proportional to temperature voltage, the SDM ADC configured to update the digital code each cycle of a clock signal;
a first storage unit coupled to "n" of the data lines that provide the "n" least significant bits of the digital code;
a second storage unit coupled to "m" of the data lines that provide the "m" least significant bits of the digital code, wherein "m" is greater than "n"; and
control logic configured to instruct the first storage unit to sample the "n" data lines that provide the "n" least significant bits of the digital code $2^n$ clock cycles after the SDM ADC first outputs an initial value of the digital code onto the bus and to instruct the second storage unit to sample the "m" data lines that provide the "m" least significant bits of the digital code $2^m$ clock cycles after the SDM ADC first outputs the initial value of the digital code onto the bus.

16. The apparatus of claim 15, wherein the SDM ADC further comprises a comparator configured to output a comparison signal each cycle of the clock signal based on the bandgap voltage and the proportional to temperature voltage, the digital code that the first storage unit stores being based on values for the comparison signal for $2^n$ consecutive clock cycles, the digital code that the second storage unit stores being based on values for the comparison signal for $2^m$ consecutive clock cycles.

17. The apparatus of claim 15, wherein the SDM ADC further comprises a comparator configured to output a comparison signal each cycle of the clock signal based on the bandgap voltage and the proportional to temperature voltage, the control logic comprising a counter configured to output the digital code on the data lines based on values for the comparison signal for a group of consecutive clock cycles.

18. The apparatus of claim 15, wherein the SDM ADC is configured to, for each cycle of the clock signal:
sample the bandgap voltage and the proportional to temperature voltage; and
integrate based on the sampled bandgap voltage and the sampled proportional to temperature voltage and a previous output of the SDM ADC.

19. The apparatus of claim 18, wherein the SDM ADC further comprises:

a fully differential amplifier having a first output and a second output, wherein the SDM ADC is configured to perform a first integration based on the sampled bandgap voltage and a first signal at the first output and to perform a second integration based on the sampled proportional to temperature voltage and a second signal at the second output;
a comparator configured to compare the first signal with the second signal each cycle of the clock signal; and
control logic configured to update the digital code each cycle of the clock signal based on the comparison of the comparator for a present clock cycle and previous cycles of the clock signal.

20. An apparatus, comprising:
reference voltage generator means for generating a proportional to temperature voltage;
analog-to-digital conversion means for converting the proportional to temperature voltage to a digital code and outputting the digital code, wherein the analog-to-digital conversion means is for performing sigma delta modulation on the proportional to temperature voltage, wherein the analog-to-digital conversion means is for updating the digital code in accordance with a clock signal;
a plurality of storage means for storing "r" least significant bits of the digital code, wherein at least two of the plurality of storage means have a different value for "r"; and
control means for instructing respective ones of the storage means to sample the digital code $2^r$ clock cycles after an initial digital code is output by the analog-to-digital conversion means.

* * * * *

UNITED STATES PATENT AND TRADEMARK OFFICE
CERTIFICATE OF CORRECTION

PATENT NO.         : 9,705,525 B1                                    Page 1 of 1
APPLICATION NO.    : 15/178377
DATED              : July 11, 2017
INVENTOR(S)        : Singh It is certified that error appears in the above-identified patent and that said Letters Patent is hereby corrected as shown below:

On the Title Page

Item (30), insert:
--(30) Foreign Application Priority Data
March 4, 2016 (IN) ....... 20161007651--

Signed and Sealed this
Tenth Day of April, 2018

Andrei Iancu
*Director of the United States Patent and Trademark Office*